(12) United States Patent
Ordentlich et al.

(10) Patent No.: US 8,949,693 B2
(45) Date of Patent: Feb. 3, 2015

(54) ANTIPODAL-MAPPING-BASED ENCODERS AND DECODERS

(75) Inventors: Erik Ordentlich, San Jose, CA (US); Ron M. Roth, Haifa (IL)

(73) Assignee: Hewlett-Packard Development Company, L.P., Houston, TX (US)

( * ) Notice: Subject to any disclaimer, the term of this patent is extended or adjusted under 35 U.S.C. 154(b) by 9 days.

(21) Appl. No.: 14/002,790

(22) PCT Filed: Mar. 4, 2011

(86) PCT No.: PCT/US2011/027127
§ 371 (c)(1),
(2), (4) Date: Sep. 3, 2013

(87) PCT Pub. No.: WO2012/121689
PCT Pub. Date: Sep. 13, 2012

(65) Prior Publication Data
US 2013/0346830 A1    Dec. 26, 2013

(51) Int. Cl.
*G11C 29/00* (2006.01)
*G06F 11/10* (2006.01)
*G11C 13/00* (2006.01)

(52) U.S. Cl.
CPC ........ *G06F 11/1076* (2013.01); *G11C 13/0002* (2013.01); *G11C 13/0007* (2013.01); *G11C 13/0023* (2013.01); *G06F 11/1048* (2013.01)
USPC .......................................... 714/767; 714/769

(58) Field of Classification Search
CPC ............ G06F 11/1048; G06F 11/1076; G11C 13/0002; G11C 13/0007; G11C 13/0023
USPC ........................... 714/792, 796, 219, 267, 269
See application file for complete search history.

(56) References Cited

U.S. PATENT DOCUMENTS

| | | | |
|---|---|---|---|
| 5,579,475 A | 11/1996 | Blaum et al. | |
| 2002/0116681 A1* | 8/2002 | Amrani et al. | 714/792 |
| 2006/0236214 A1* | 10/2006 | Ferguson | 714/796 |
| 2008/0049481 A1 | 2/2008 | Hanzawa et al. | |
| 2008/0266941 A1 | 10/2008 | Lee et al. | |
| 2009/0003040 A1 | 1/2009 | Stan et al. | |
| 2010/0296556 A1* | 11/2010 | Rave et al. | 375/219 |

* cited by examiner

*Primary Examiner* — David Ton
(74) *Attorney, Agent, or Firm* — Olympic Patent Works PLLC

(57) ABSTRACT

Examples of the present invention include an electronic-memory-system component. The electronic-memory-system component includes an array of data-storage elements and an encoder that receives input data, processes the input data as a two-dimensional array of bits by carrying out two passes, in one pass subjecting a portion of each row of the two-dimensional array of bits having more than a threshold weight to a first weight-reduction operation, and, in another pass, subjecting a portion of each considered column of the two-dimensional array of bits having more than a threshold weight to a second weight-reduction operation, one of the first and second weight-reduction operations employing an antipodal mapping and the other of the first and second weight-reduction operations employing bit inversion, generates a codeword corresponding to the input data, and stores the codeword in the array of data-storage elements.

15 Claims, 15 Drawing Sheets

$$P_{x'} = \{1\}$$

$$\left.\begin{array}{l} x' = [\text{-}1\ 1\ 1\ \text{-}1\ 1\ \text{-}1\ 1\ 1\ 1\ \text{-}1\ \text{-}1\ \text{-}1\ 1] \\ \downarrow \odot \\ y' = \phi'(x') = [\text{-}1\ \text{-}1\ 1\ \text{-}1\ 1\ \text{-}1\ 1\ 1\ 1\ \text{-}1\ \text{-}1\ \text{-}1\ 1] \end{array}\right\} 524$$

$$y = \phi(x) = b^{-1}(y') = [0\ 0\ 1\ 0\ 1\ 0\ 1\ 1\ 1\ 0\ 0\ 0\ 1] \longleftarrow 526$$

$$\left.\begin{array}{l} |y| = 6 \\ n = 13 \\ \dfrac{n}{2} = 6.5 \\ |y| < \dfrac{n}{2} \end{array}\right\} 528$$

$$\left.\begin{array}{l} y = [0\ 0\ 1\ 0\ 1\ 0\ 1\ 1\ 1\ 0\ 0\ 0\ 1] \\ c(y) = [0\ 1\ 1\ 1\ 0\ 0\ 0\ 1\ 0\ 1\ 0\ 1\ 1] \end{array}\right\} 530$$

$$\underbrace{\phantom{xxx}}_{531}$$

$$[c(y)]' = [\text{-}1\ 1\ 1\ 1\ \text{-}1\ \text{-}1\ \text{-}1\ 1\ \text{-}1\ 1\ \text{-}1\ 1\ 1] \longleftarrow 532$$

$$P = \{11\} \qquad \downarrow \odot \longleftarrow 534$$

$$[c(x)]' = \phi'([c(y)]') = [\text{-}1\ 1\ 1\ 1\ \text{-}1\ \text{-}1\ \text{-}1\ 1\ \text{-}1\ 1\ \text{-}1\ \text{-}1\ 1] \longleftarrow 536$$

$$c(x) = [0\ 1\ 1\ 1\ 0\ 0\ 0\ 1\ 0\ 1\ 0\ 0\ 1] \longleftarrow 538$$

$$x = c(c(x)) = [0\ 1\ 1\ 0\ 1\ 0\ 1\ 1\ 1\ 0\ 0\ 0\ 1] \longleftarrow 540$$

FIG. 5B

ANTIPODAL-MAPPING-BASED ENCODERS AND DECODERS

TECHNICAL FIELD

The present invention is related to coding and electronic memories and, in particular, to methods and systems for encoding information for storage in electronic memories associated with constraints related to the encoded information.

BACKGROUND

Error-control coding is a well-developed, interdisciplinary field that spans applied mathematics, computer science, and information theory. Error-control coding techniques are used throughout modern computing, communications, and data-storage systems. In general, error-control coding involves supplementing digitally encoded information with additional, redundant information in order to render the encoded information less susceptible to corruption or loss due to various types of transmission errors, errors that arise as the encoded information is passed through various types of physical and logical interfaces, and errors that arise when the information is stored in, and retrieved from, various types of electronic data-storage media. Other types of coding techniques may employ redundant information for different reasons, or for both error correction and for additional purposes.

Recently, a new generation of electrical-resistance-based memories, various types of which include one-dimensional, two-dimensional, and three-dimensional arrays of nanoscale resistors or memristors, has been developed for a variety of data-storage and computational applications. These newly developed memory arrays have various electronic and physical properties and characteristics that constrain the types of data that can be stored within, and retrieved from, the memories. Researchers and developers of these new types of memories therefore are seeking coding techniques that can accommodate the data constraints associated with electrical-resistance-based memories, and error-control-coding theoreticians and researchers continuously seek new methods and systems that include coding applicable to newly encountered and not-yet encountered applications.

BRIEF DESCRIPTION OF THE DRAWINGS

FIGS. 5A-B illustrate an antipodal mapping of a bit string x to a bit string y, x=$\phi$(y), and the antipodal mapping of bit string y back to x, y=$\phi$(x).

DETAILED DESCRIPTION

Methods and systems that represent examples of the present invention are directed to encoding information to produce encoded information that is compatible with constraints associated with electrical-resistance-based memories and useful in other, similarly constrained applications. Methods and systems that represent examples of the present invention employ encoding and decoding techniques based on bitwise complementation operations and antipodal mappings of bit strings.

It should be noted, at the onset, that the method examples of the present invention, discussed below, are necessarily implemented for execution on a computer system and/or implemented as logic circuits within an electronic memory device, electronic memory data-storage system, or other types of electronic devices and systems. When these methods are executed by a general-purpose computer, the general-purpose computer is transformed into a special-purpose encoding and decoding machine that represents a system example of the present invention. Similarly, when these methods are implemented within a memory controller or other hardware device, the memory controller or other hardware device represents a device or system example of the present invention. The methods of the present invention cannot be carried out by hand calculation or by mental calculation, because the methods involve very large numbers of arithmetic and logic operations, even when small amounts of information are encoded. Calculation by any means other than an electronic computer or other electronic device would take many orders of magnitude of time in excess of the times needed for preparing data for storage in electronic memories, and would be far too error prone to serve any practical purpose.

In a first subsection, below, electrical-resistance-based memories are described, along with a data constraint associated with certain electrical-resistance-based memories. In a second subsection, certain coding techniques are described. In a third subsection, certain examples of the present invention are discussed.

Electrical-Resistance-Based Memories

Figure 1:
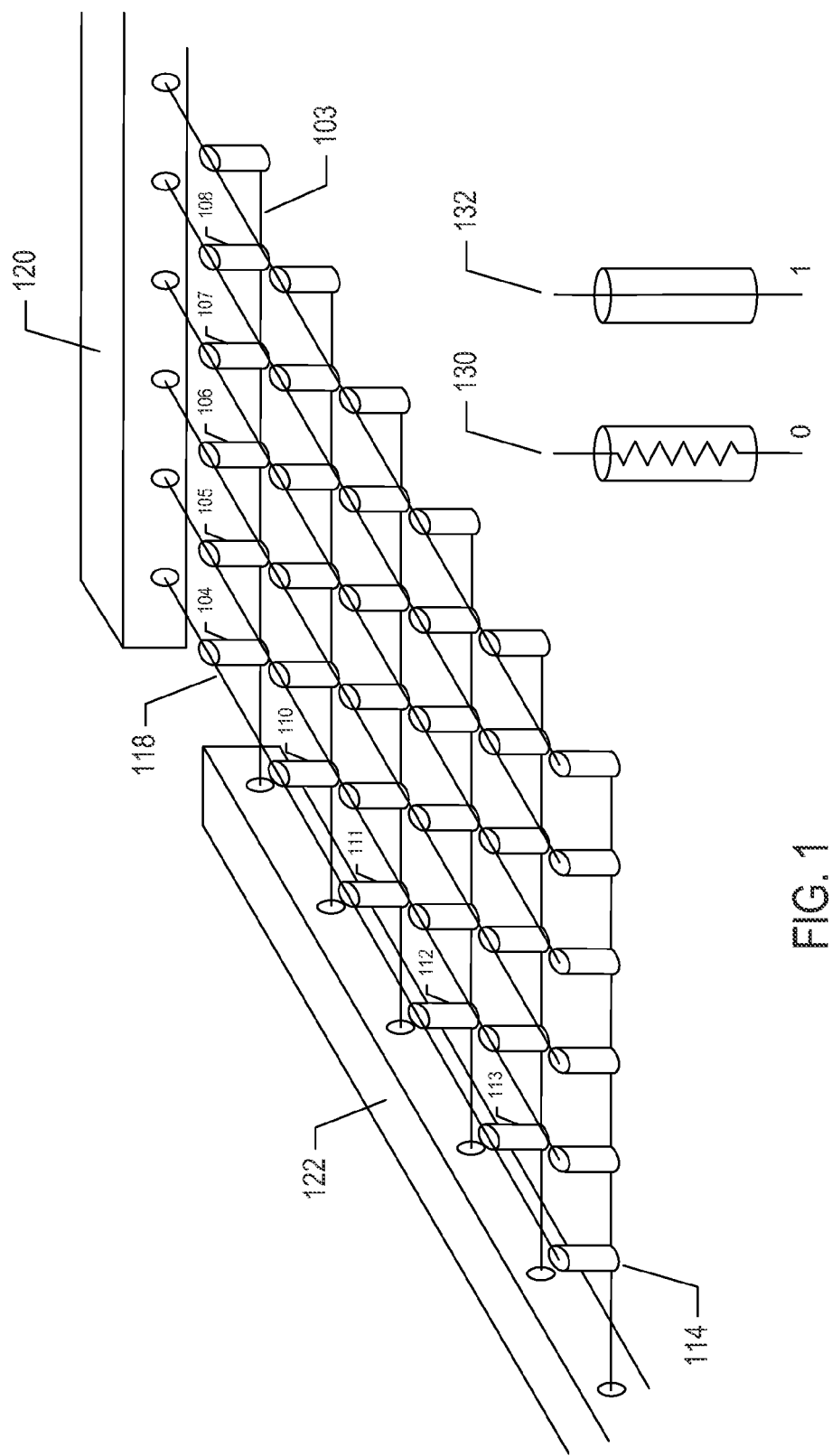
FIG. 1 illustrates a new type of electronic data-storage device that has been recently developed.

FIG. 1 illustrates a new type of electronic data-storage device that has been recently developed. The device shown in FIG. 1 is a two-dimensional array of memory elements, each element of which, such as element 104, can store a single bit of information. Each memory element is connected to a row signal line, such as the row of memory elements 104-109 in FIG. 1 connected to row signal line 103, and a column signal line, such as the column of memory elements 104 and 110-114 connected to column signal line 118. The column signal lines emanate from a column demultiplexer 120 and the row signal lines emanate from a row demultiplexer 122. A given memory element can be accessed by controlling the voltage states of the column signal line and row signal line to which the memory element is connected. In resistor-based or memristor-based memory arrays, the memory elements may reside in one of at least two different states 130 and 132 distinguishable by the electrical resistance of the memory element. For example, as shown in FIG. 1, when a memory element is in the high-resistance state 130, the memory element is considered to store a bit value "0," and when the memory element is in the low-resistance state 132, the memory element is considered to store the bit value "1." Of course, the opposite convention can be used, in which the low-resistance state is considered to represent bit value "0" and the high-resistance state is considered to represent bit value "1." In general, memory elements are read by applying low voltages across the memory elements and detecting the presence or absence of current flow greater than a relatively low, threshold value. Memory elements are written by applying large positive or negative voltages across the memory elements in order to change the electrical resistance of the memory element.

Figure 2:
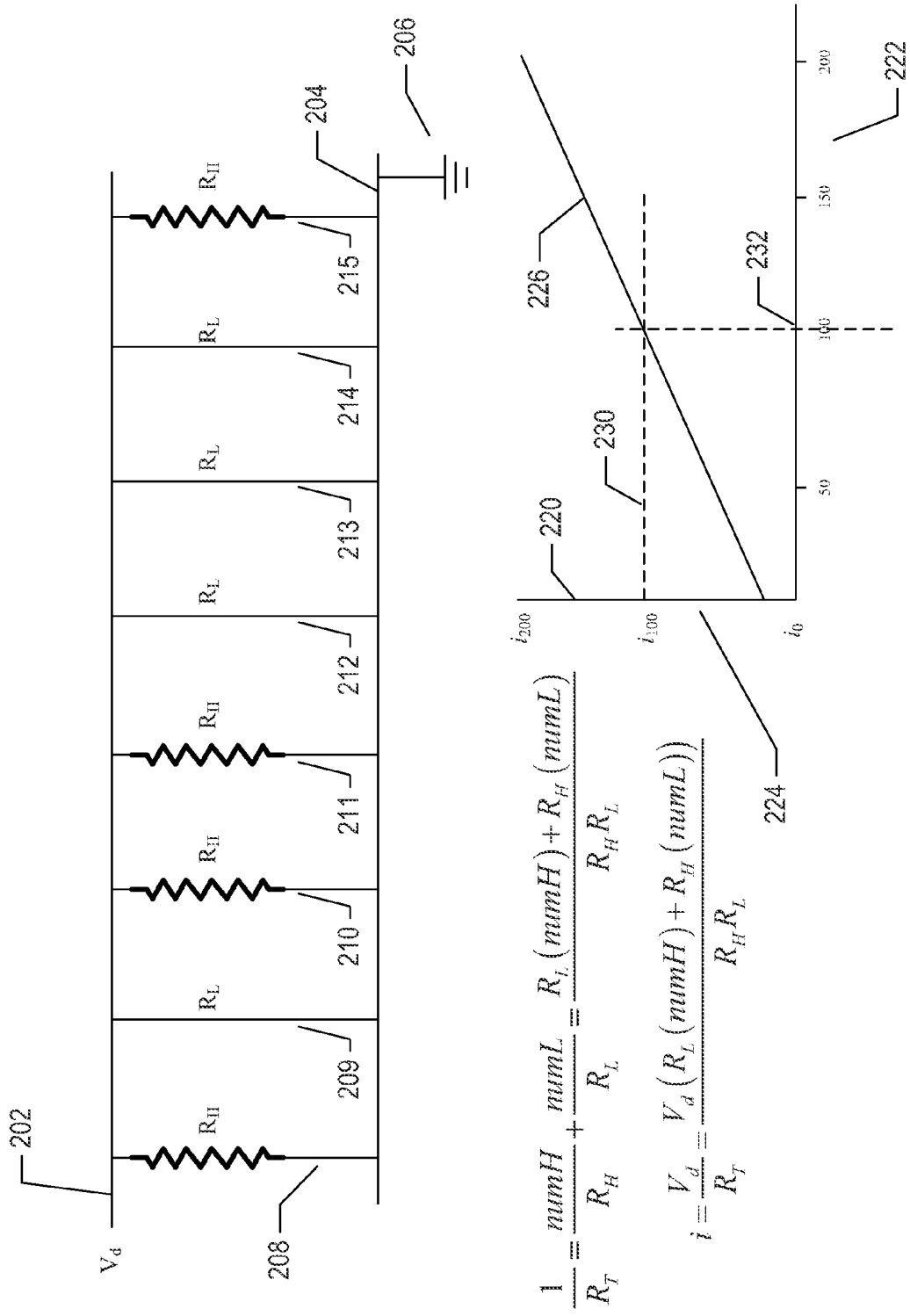
FIG. 2 illustrates a constraint encountered in electrical-resistance-based memories.

FIG. 2 illustrates a constraint encountered in electrical-resistance-based memories. In FIG. 2, a column of memory elements within a two-dimensional resistor-based memory array is shown. Signal line 202 is the column signal line and the lower line 204 represents the plain row signal lines, all of which are pulled to ground 206. The column signal line 202 is placed at voltage $V_d$ with respect to ground. The eight memory elements 208-215 are either in a high-resistance state with resistance $R_H$, such as memory element 208, or in a low-resistance state, with resistance $R_L$, such as memory element 209. The current passing through the column signal line 202 can be computed in terms of the number of memory elements in the high-resistance state, numH, and the number of memory elements in the low resistance state, numL, as follows:

$$\frac{1}{R_T} = \frac{numH}{R_H} + \frac{numL}{R_L} = \frac{R_L(numH) + R_H(numL)}{R_H R_L}$$

$$i = \frac{V_d}{R_T} = \frac{V_d(R_L(numH) + R_H(numL))}{R_H R_L}$$

Note that the above expressions hold for columns with an arbitrary number of memory elements. A plot of the current i, plotted with respect to a vertical axis 220, versus the number of memory elements in a column or row of a two-dimensional resistor-based memory array in the low-resistance state, plotted with respect to the horizontal axis 222, is shown in graph 224 in FIG. 2. The current-versus-number-of-low-resistance-memory-element curve in graph 224 is linear 226. The column or row for which the curve is shown in graph 224 contains 200 memory elements, and the current ranges from $i_0$ to $i_{200}$ as numL increases from 0 to 200 and numH decreases from 200 to 0.

When, in certain types of resistance-based memory arrays, particularly those with nanoscale components, too many memory elements are in the low-resistance state, the current flow through a column signal line or row signal line that interconnects them may be sufficiently high to damage or destroy the signal line and the memory array containing the signal line, and, even when not sufficiently high to destroy the signal line, may be sufficiently high to induce various unwanted current paths through unselected memory elements. Thus, as also shown in graph 224 in FIG. 2, a memory array may be constrained to store data that can be represented in the array with no more than a threshold number of memory elements in any row or column in the low-resistance state at any particular point in time. As an example, in graph 224, the current $i_{100}$ 230 represents the highest current that can be safely carried by a column signal line or row signal line, corresponding to 100 memory elements 232 out of 200 memory elements being in the low-resistance state.

Figure 3:
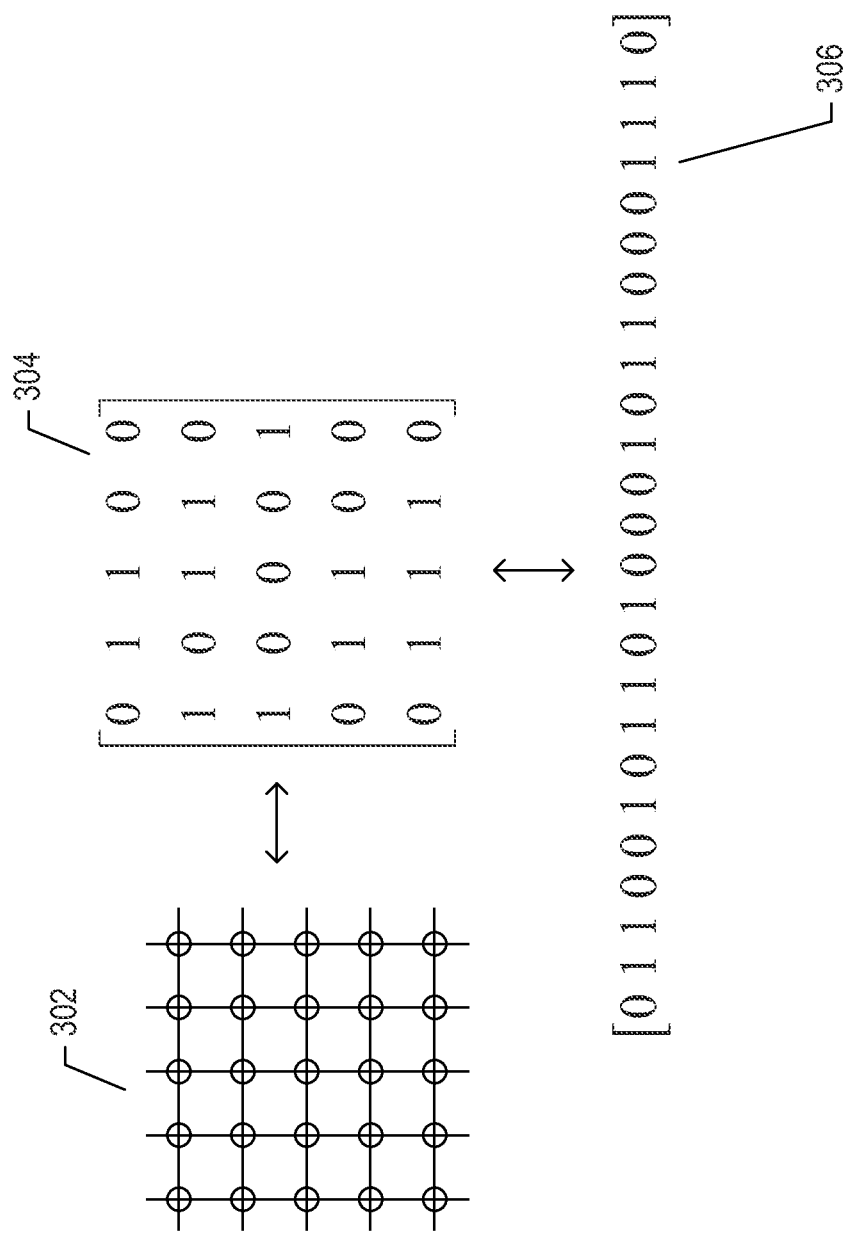
FIG. 3 illustrates conventions used in subsequent discussion of examples of the present invention.

FIG. 3 illustrates conventions used in subsequent discussion of examples of the present invention. The data state of a physical, two-dimensional memory array 302 can be represented as a two-dimensional array of bit values 304, with each bit value corresponding to the resistance state of a single memory element. The two-dimensional bit array 304 can be alternatively viewed as a one-dimensional vector 306 in which the bit values in the two-dimensional array are ordered according to an arbitrary but deterministic ordering scheme. For example, in FIG. 3, the bit vector 306 is constructed as the concatenation of successive rows of the two-dimensional bit array 304, starting with the top-most row, in right-to-left order. Examples of the present invention are directed to encoding input information into two-dimensional-array codewords, referred to as "array codewords," or one-dimensional-array codewords, referred to as "vector codewords," that correspond to the memory elements in a physical two-dimensional memory array such that each vector codeword contains a number of bits with value "1" fewer than, or equal to, a threshold number and no row or column of any array codeword has more than a threshold number of bits with value "1." An equivalent constraint is to choose a threshold number one greater than the maximum allowed number of bits with value "1," and to ensure that each vector codeword contains a number of bits with value "1" fewer than the threshold number.

In the following discussions, the binary contents of a row of memory elements within a two-dimensional memory array are considered to together logically compose a bit string, with the bits ordered from the leftmost memory element to the rightmost memory element of the row of memory elements within two-dimensional memory array. Similarly, the binary contents of a column of memory elements within a two-dimensional memory array are considered to together compose a bit string, with the bit values ordered from the topmost memory element to the lowest memory element within the column of memory elements within two-dimensional memory array. The Hamming weight of a bit string is the number of bits with binary value "1" in the bit string. It is natural to express the above-discussed data constraints in terms of threshold Hamming weights for the bit strings composed of the binary values stored in the rows and columns of a two-dimensional memory array.

Figure 4:
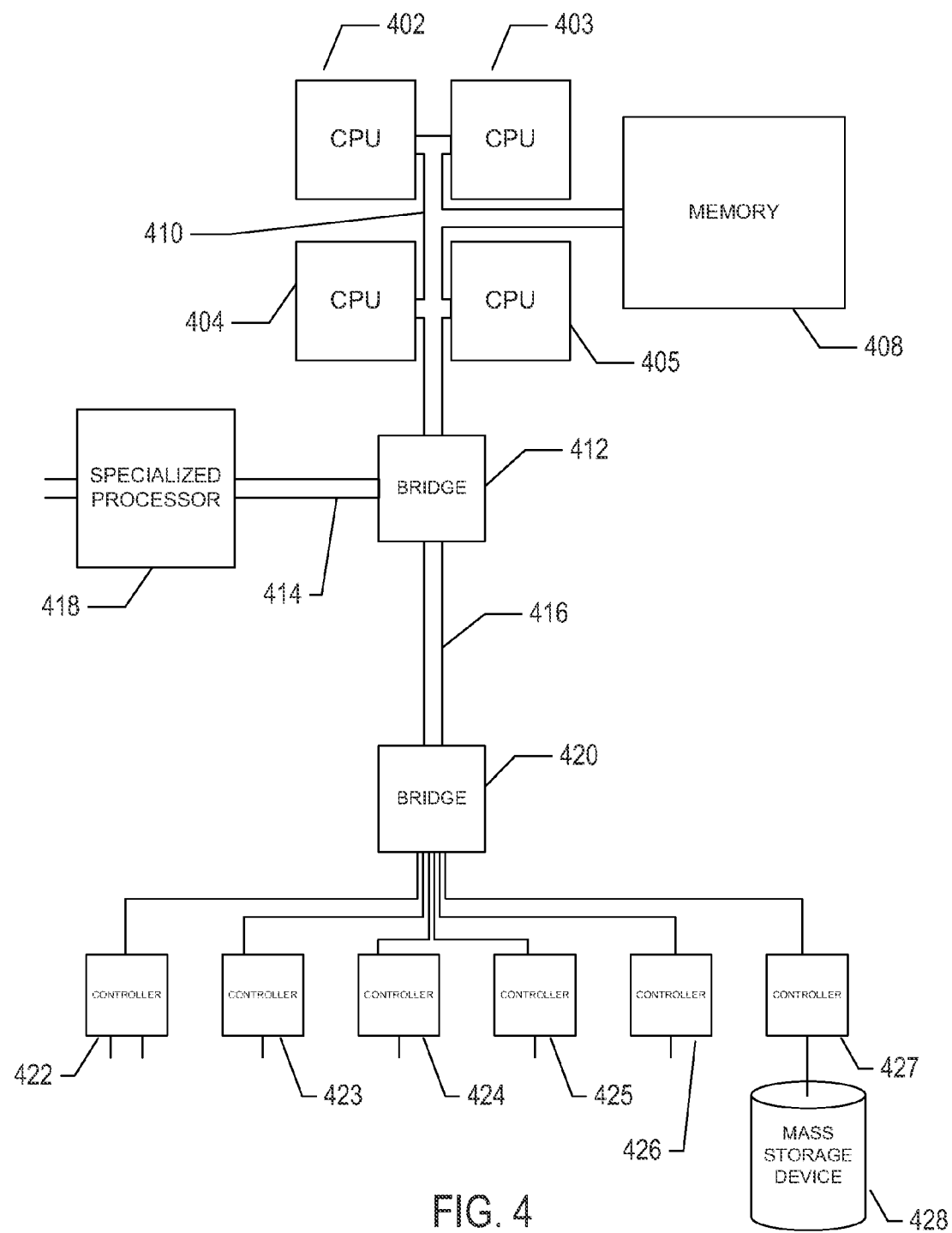
FIG. 4 illustrates a general-purpose computer system that, when executing an implemented method example of the present invention, comprises a system example of the present invention.

FIG. 4 illustrates a general-purpose computer system that, when executing an implemented method example of the present invention, comprises a system example of the present invention. The computer system contains one or multiple central processing units ("CPUs") 402-405, one or more electronic memories 408 interconnected with the CPUs by a CPU/memory-subsystem bus 410 or multiple busses, a first bridge 412 that interconnects the CPU/memory-subsystem bus 410 with additional busses 414 and 416, or other types of high-speed interconnection media, including multiple, high-speed serial interconnects. These busses or serial interconnections, in turn, connect the CPUs and memory with specialized processors, such as a graphics processor 418, and with one or more additional bridges 420, which are interconnected with high-speed serial links or with multiple controllers 422-427, such as controller 427, that provide access to various different types of mass-storage devices 428, electronic displays, input devices, and other such components, subcomponents, and computational resources. Examples of the present invention may also be implemented on distributed computer systems and can also be implemented partially in hardware logic circuitry.

Examples of the Present Invention

As discussed above, examples of the present invention are directed to encoding and decoding techniques for coding information to be stored in memory arrays and memory vectors and decoding information retrieved from memory arrays and memory vectors, with the codewords produced by coding examples of the present invention satisfying the above-discussed data constraint. For example, the constraint may specify that no row or column in a two-dimensional bit-matrix codeword can have a Hamming weight greater than a threshold value. In examples used to illustrate examples of the present invention, array codewords may be constrained to have no column or row with a Hamming weight greater than m/2 or n/2, respectively, where m is the number or rows and n is the number of columns of the array, for m and n both even, and similarly constrained to have no column or row with a Hamming weight greater than $$\lceil \frac{m}{2} \rceil \text{ or } \lceil \frac{n}{2} \rceil,$$

respectively, where $\lceil x \rceil$ indicates the ceiling of x, the smallest integer greater or equal to x.

Please note that, in the following discussion, the bits in a bit string are generally indexed starting with index 0 and ending with index n−1, where n is the length of the bit string. By contrast, the rows and columns of arrays are generally indexed starting with index 1 and ending with index m or n, respectively, for an m×n array.

Certain of the example implementations of the coding method and system of the current invention employ an antipodal mapping $\phi$ that maps bit strings of length n to the same or a different bit string of length n. In the following discussion, columns operations are employed in which a bit string x is mapped to a bit string y by an antipodal mapping $\phi$. As one example:

$$[01011101001] \xrightarrow{\phi} [01001101001]$$
$$\quad\quad x \quad\quad\quad\quad\quad y$$

More compactly:

$$y=\phi(x)$$

Using the convention that $|z|$ indicates the Hamming weight of bit string z, and the convention that $z_i$ refers to the $i^{th}$ bit in bit string z, an antipodal mapping $y=\phi(x)$ has the following properties:

length (x)=n=length (y)

$|x|=k \Rightarrow |y|=n-k$ $y_i=1 \Rightarrow x_i=1$ when $|x| \leq n/2$ $x_i=1 \Rightarrow y_i=1$ when $|x| < n/2$ $\phi(\phi(x))=\phi(y)=x$ In other words, the antipodal mapping maps a string x of length n into a bit string y of length n. When the Hamming weight, or number of bits with binary value "1" in string x is equal to k, then the Hamming weight of string y to which string x is mapped by the antipodal mapping $\phi$ is n−k. Thus, when k>n/2 the antipodal mapping $\phi$ can be used to produce a bit string y with Hamming weight <n/2. In this respect, the antipodal mapping is similar to bitwise complementation, or bitwise binary-value inversion, of a bit string in that the antipodal mapping can be used to lower the Hamming weight of a bit string of length n with Hamming weight >n/2. When the Hamming weight of bit string x is greater than or equal to n/2, then the antipodal mapping oh produces a bit string y in which all bits with binary value "1" correspond to bits in bit string x with binary value "1." Thus, the antipodal mapping does not change bits with binary value "0" in x into bits with binary value "1" in y. Similarly, when the Hamming weight of bit string x is less than n/2, and the antipodal mapping of x to y produces the bit string y with Hamming weight greater than n/2, no bit with binary value "1" in bit string x is changed to have binary value "0" in y by the antipodal mapping. Finally, the antipodal mapping has a self-inverse property, as expressed by the last of the above-provided equations.

An antipodal mapping can be implemented in many different ways. One way to carry out an antipodal mapping is next described, and represents an example of the present invention. This first antipodal-mapping implementation employs two additional bit-string mappings or operations. The first mapping reverses and complements, or flips, or flips, the values of each bit in a string x to produce the reversed and complemented bit string c(x):

$$c(x)=\text{reverse and complement}=[\bar{x}_{n-1}, \bar{x}_{n-2} \ldots, \bar{x}_0]$$

In the above equation, the notation $\bar{z}_i$ indicates the flipped value of $z_i$. The term "flipped" is equivalent to "complemented," "inverted," and "opposite" for binary values presently discussed. Thus, when $z_i$ has binary value "0," $\bar{z}_i$ has binary value "1," and when $z_i$ has binary value "1," $\bar{z}_i$ has binary value "0." Using the example above, with x=[01011101001]:

$$c(x)=[01101000101]$$

A second mapping, or operation, changes the value of all bits in a bit string with binary value "0" to the value "−1." In other words, this operation changes the logical meaning of a bit, from storing either "1" or "0" to storing either "1" or "−1." This provides for adding a series of bit values according to ordinary integer arithmetic. Whereas, in binary arithmetic, two binary values sum to either "0" or "1," following the second mapping of a bit string, the values of two bits may sum to one of the integers {−2, 0, 2}. In the following discussion, bit strings transformed by the second mapping to have bits with values "1" and "−1" are primed. It should be noted that the second mapping is a logical mapping. This second mapping, and its inverse, need not be physically carried out, but, instead, bit operations on strings mapped by the second mapping have different meanings than for bit strings in which the bits are considered to represent binary values "0" and "1." In more concise notation, the second mapping is described as follows:

b (x) maps each element with value 0 in x to have value −1

$$x' = b(x)$$

$$x'_i = \begin{cases} -1 & \text{when } x_i = 0 \\ 1 & \text{when } x_i = 1 \end{cases}$$

There is a corresponding inverse transformation $b^{-1}$, defined as follows:

$$x = b^{-1}(x')$$
$$x_i = \begin{cases} 0 & \text{when } x'_i = -1 \\ 1 & \text{when } x'_i = 1 \end{cases}$$

The function $s(x',i,\delta)$ adds together a sequence of $\delta+1$ successive bits within bit string x', starting at bit position i, with the successive bits wrapping back from the end of the bit string x' to the beginning of the bit string x' to obtain $\delta+1$ bits to add together. More compactly, $$s(x', i, \delta) = x'_i + \ldots x'_{(i+\delta) \bmod n}$$

When $\delta=0$, the function $s(x', i, \delta)=x'_i$. The sum of all bits within a bit string, $s(x')$, can be expressed as follows:

$$s(x')=s(x', 0, n-1)=x'_0+x'_1+\ldots+x'_i++x_{n-1}$$

The set of minimal positions P for a bit string x' is denoted $P_{x'}$. The set of minimal positions are defined for any bit string x' with a sum $s(x')$ greater than 0, as follows:
when $s(x')>0$ $$i \in P_{x'}, \text{ when } s(x', i, \delta)>0 \text{ for } \delta\geq 0$$

In other words, a minimal position i is a position within bit string x' for which the function $s(x', i, \delta)$ is greater than 0 for all possible values of $\delta$ greater than or equal to 0. Clearly, those positions with binary values "1" are candidates for being minimal positions, since $s(x', i, 0)$ is less than 0 for a bit position i with value "-1" in x'.

Calculation of the minimal positions $P_{x'}$ for a bit string x' provides for a straightforward implementation of a function $\phi'$ that maps a bit string x' of length n to a bit string y' of length n:

$$y' = \phi'(x')$$
$$y'_i = \begin{cases} x'_i & \text{when } i \notin P_{x'} \\ -x'_i & \text{when } i \in P_{x'} \end{cases}$$

In other words, the function $\phi'$ inverts the value at each minimal position within a bit string transformed by the second mapping b( ).

One implementation of the antipodal mapping $y=\phi(x)$ can be expressed as follows:

$$\phi(x)=b^{-1}(\phi'(b(x))) \text{ when } |x|>n/2$$

$$\phi(x)=c(\phi'(c(x))) \text{ when } |x|<n/2$$

$$\phi(x)=x \text{ when } |x|=n/2$$

Figure 5A:
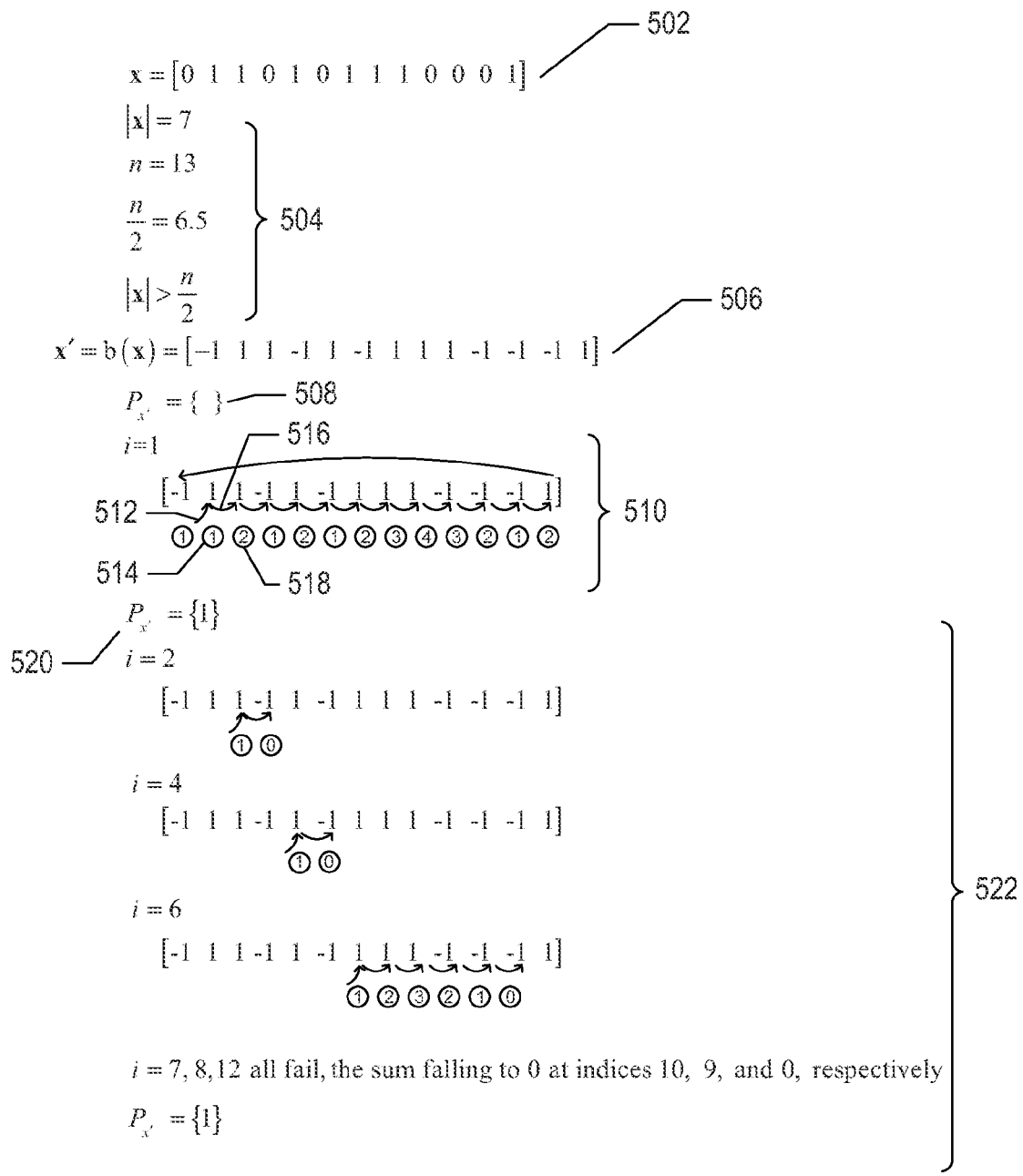

FIGS. 5A-B illustrate an antipodal mapping of a bit string x to a bit string y, $x=\phi(y)$, and the antipodal mapping of bit string y back to x, $y=\phi(x)$. The bit string corresponding to x 502 is shown at the top of FIG. 5A, followed by the Hamming weight and other characteristics 504 of the bit string x. Because the Hamming weight of the bit string x is greater than n/2, the antipodal mapping is expressed by the first of the above-provided three equations that express a first implementation of the antipodal mapping. First, bit string x is converted into bit string x' by the mapping b(x), as shown on line 506 in FIG. 5A. The set of minimal positions $P_{x'}$ is next set to the empty set 508. Then, each position in x' is tested for minimality. As discussed above, positions with binary values of "-1" cannot be minimal positions, so those positions with binary value "1" are tested. The first position with binary value "1" is position i=1, for which the test for minimality is shown on lines 510 in FIG. 5A. Arrow 512 indicates starting of the test at bit position i=1, and the circled value "1" 514 indicates that, at bit position i=1, the value of the function $s(x', i, 0)$ is "1." Each successive arrow, such as arrow 516, represents the addition of a next, successive bit, corresponding to the next of a set of functions $s(x', i, \delta)$ with monotonically increasing values of $\delta$, with the resulting binary value shown as the next circled value, such as circled value 518 corresponding to the addition operation represented by arrow 516. As can be seen by following successive additions, the value of the function $s(x', i, \delta)$ remains positive for values of $\delta$ in the set of increasing values $\{0, 1, \ldots, n-1\}$. Because the function remains positive for these values, the function remains positive for any, arbitrary value of $\delta$ that is greater than or equal to 0. Thus, position i=1 is a minimal position, and the set $P_{x'}$ is now equal to a set containing a single bit position 1 (520 in FIG. 5A). The remaining lines 522 of FIG. 5A describe testing of the remaining positions of x' having binary value "1" for minimality. As a result of exhaustive testing of all the bits having binary value "1" within bit string x', the position i=1 is found to be minimal in the example illustrated in FIG. 5A.

Proceeding to FIG. 5B, the function $\phi'$ is implemented by flipping the binary values at each minimal position in x', as shown in lines 524 of FIG. 5B. Finally, the antipodal mapping is obtained through the operation $b^{-1}( )$, as shown on line 526 in FIG. 5B. The bit string y that represents the antipodal mapping of x is characterized on lines 528 of FIG. 5B.

In order to obtain the antipodal mapping of y, the second of the three equations that express a first implementation of antipodal mapping, provided above, is used. First, as shown in lines 530 of FIG. 5B, the reverse-and-complement operation c( ) is carried out on y to produce c(y). In FIG. 5B, arrows, such as arrow 531, are provided to show the reverse ordering of the elements for a few elements of y. Next, as shown on line 532, the bit string c(y) is transformed to the bit string [c(y)]' using the b( ) transformation. Analysis of this bit string for minimal positions reveals that the sole minimal position in [c(y)]' is position 11. The binary value of this position is flipped, or complemented, 534 to produce the bit string $\phi'([c(y)]')$ 536, which is also alternatively expressed in FIG. 5B as [c(x)]'. Application of the operation b'( )to [c(x)]' produces the string c(x) 538, and application of the operation c( ) this string finally produces bit string x 540. As can be observed by comparing bit string x on line 540 in FIG. 5B to bit string x on line 502 of FIG. 5A, antipodal mapping of x to y followed by antipodal mapping of y to x results in the same bit string x to which the first antipodal mapping is applied.

There are many different ways to generate antipodal mappings. The above discussion is provided to describe antipodal mappings and properties of antipodal mappings, and to provide an example implementation of an antipodal mapping. Encoding and decoding techniques that represent examples of the present invention may employ any of the various possible antipodal-mapping methods.

The antipodal mapping, discussed above, provides a basis for an efficient method and system for coding input bit strings for storage in crossbar arrays, so that the weight of each row and column within an m×n crossbar array is equal to or less than $\lceil \frac{m}{2} \rceil$ and $\lceil \frac{n}{2} \rceil$, respectively. In the case that both m and n are even, the coding method and system based on antipodal mappings that represents one example of the present invention ensures that no row or column has a Hamming weight of more than m/2 and n/2, respectively. As discussed above, these Hamming-weight constraints on rows and columns ensure that the number of bits with the value "1" in each row and column does not exceed a threshold number of "1" bits that could produce sufficiently low resistance in a row or column of a crossbar to damage the crossbar or produce unwanted secondary current paths that, in turn, lead to data corruption.

Figure 6:
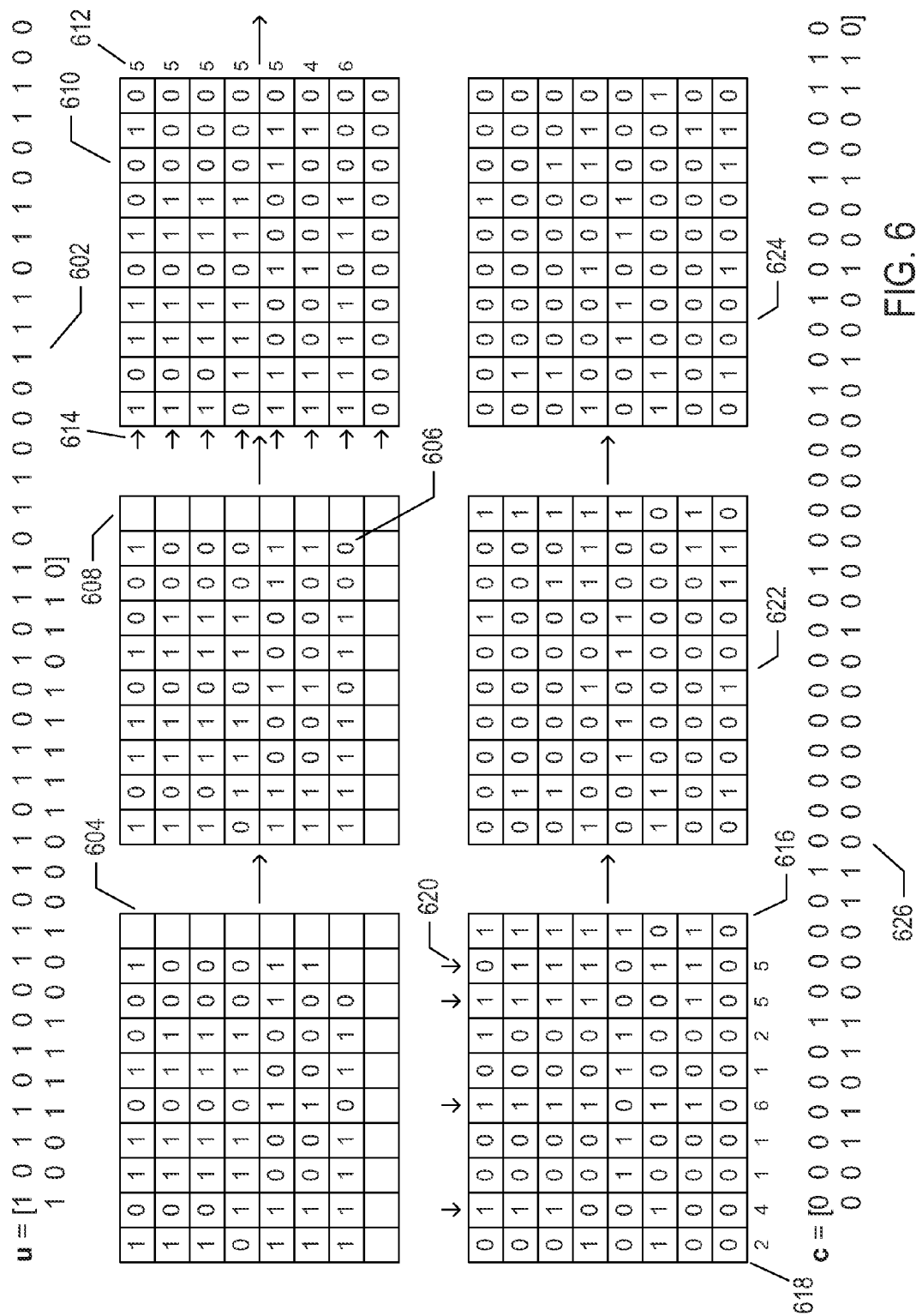
FIG. 6 illustrates encoding of a bit string to produce an encoded bit string according to one example of the present invention.
Figure 7:
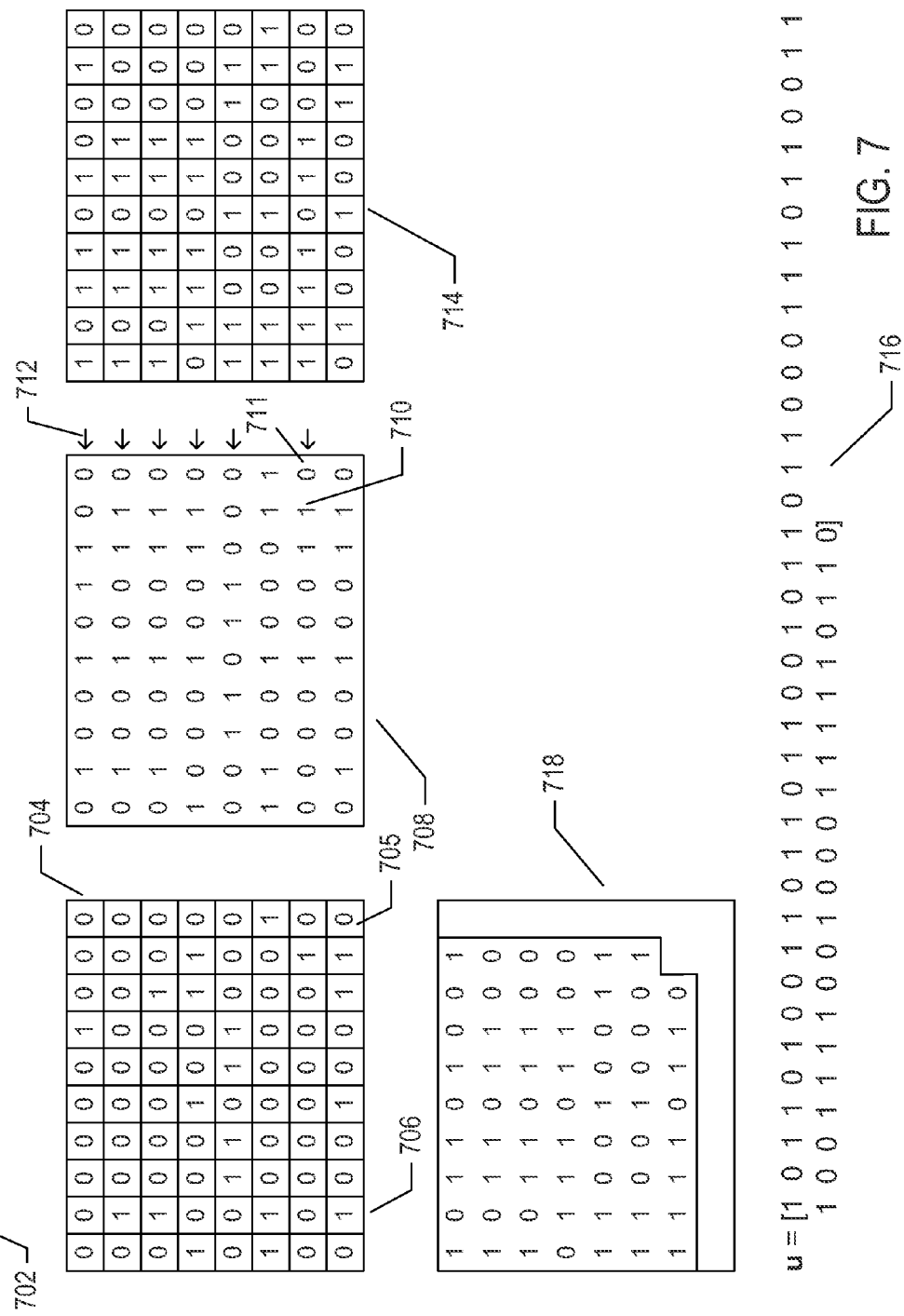
FIG. 7 illustrates decoding of the encoded bit string produced in the example shown in FIG. 6 according to one example of the present invention.

The antipodal-mapping-based bit-string encoding and decoding method that represents one example of the current invention is next illustrated, using example bit strings. FIG. 6 illustrates encoding of a bit string to produce an encoded bit string according to one example of the present invention. FIG. 7 illustrates decoding of the encoded bit string produced in the example shown in FIG. 6 according to one example of the present invention.

In FIG. 6, a 62-bit bit string u 602 is shown at the top of the page. According to one example of the present invention, this 62-bit bit string can be encoded into an 80-bit bit string c for storage into an 8×10 crossbar array. In a first step, successive groups of nine bits, which is one less than the number of columns in the array, are extracted from u and placed into the first nine positions of successive rows of the 8×10 array 604. Note that the final row has eight bits. Thus, for an m×n array, (m−1)(n−1)−1 bits can be encoded into mn bits for storage in the m×n array. In the present example, with m=8 and n=10, the m×n array can store 7×9−1=62 information bits.

In a second step, a binary value "0" 606 is added to the last row of information bits, so that the bits from the bit string u form a full (m−1)×(n−1) array in the left, upper portion of the m×n array 608. In a third step, the final column and final row of the m×n array are filled with binary values "0." This produces a full m×n array 610. In FIG. 6, in preparation for a next step, the Hamming weights of the first m−1 rows are shown in a column 612 to the right of the m×n array 610. In a next step, each row for which the Hamming weight is greater than or equal to the number of columns divided by 2, n/2 , is flipped, or complemented. The rows with Hamming weight greater than or equal to n/2 are marked with small arrows in a column 614 of small arrows to the left of the m×n array. Flipping of the binary values in each of these rows leads to m×n array 616. Note that the flipping of rows with Hamming weights greater than or equal to n/2 has, in general, decreased the overall Hamming weight of the array at the expense of increasing the Hamming weight of the final column in the array.

In FIG. 6, the Hamming weights of each of the first n−1 columns in the array, following the row-flipping operations, is shown in a horizontal row of Hamming weights 618 below the array, in preparation for a next step in the coding method. In the next step, each of these columns for which the Hamming weight is greater than or equal to m/2 is altered by an antipodal-mapping-based operation. The columns with Hamming weights greater than or equal to m/2 are indicated, in FIG. 6, by small arrows, such as arrow 620, above the columns with Hamming weight greater than or equal to m/2. The first m−1 entries in each of these columns is mapped, by the above-discussed antipodal mapping, to a replacement column of m−1 entries, which is inserted in place of the original column in the array, producing array 622 shown in FIG. 6. For each column to which the antipodal mapping is applied, the 0 in the m-th row in that column is changed to a 1. The antipodal-mapping-based column operations result in a general decrease in the Hamming weight of the array at the expense of increasing the Hamming weight of the last row in the array. Because of the above-mentioned properties of the antipodal mapping, the antipodal-mapping-based operations on columns of the two-dimensional array cannot increase the number of "1" values in any of the first m−1 rows , and therefore no row is modified to violate the weight constraints as a result of the antipodal-mapping-based operations.

In a next operation, when the last row of the array, row m, has a Hamming weight greater than n/2, the entire last row of the array is flipped, or, in other words, the values of the bits in the row are inverted. Because the Hamming weight of the last row in array 622 in FIG. 6 is 4, which is less than n/2=5, inversion of the last row is not carried out in this example. In a next step, when the last column has a Hamming weight greater than m/2 the initial m−1 entries in the last column are flipped, or inverted. Because the Hamming weight of the last column in array 622 is 6, which is greater than m/2=4, the binary values in the first m−1 entries of the last column are inverted to produce the final array 624. In a final step, the entries in this array are extracted, row-by-row, and appended to an initially empty string c to produce the code word c, with 80 binary values, 626 shown at the bottom of FIG. 6.

The redundancy for the above-described encoding method is m+n. In the current example, the 62-bit initial bit string u is encoded into code word c with 62+m+n=62+18=80 bits. As mentioned above, the encoding method that represents an example of the present invention guarantees, for even m and n, that no column will have more than m/2 entries with binary value "1" and that no row will have more than n/2 entries with binary value "1" when the code word is stored into an m×n array by extracting successive rows of entries from the code word. In many cases, the total Hamming weight of the array is considerably less than (m/2)n, which is the maximum number of entries with binary value "1" that can be arranged within the array without violating a row or column constraint. In the example shown in FIG. 6, the initial bit string u has 35 bits with binary value "1" while the code word c has 20 bits with binary value "1."

FIG. 7 illustrates the decoding process, using, as an example, the code word c generated from the initial bit string u in the example encoding shown in FIG. 6. The 80-bit code word c 702 is shown at the top of FIG. 7. In a first step, successive groups of n bits are extracted from the code word and entered as successive rows into an m×n array 704. In the example shown in FIGS. 6 and 7, m=8 and n=10. This is an inverse operation with respect to the final linearization of the contents of array 624 used to generate code word c in the encoding example shown in FIG. 6. In a next step, when the final bit of the final row 705 has the binary value "1," the final row is recognized as having been flipped during encoding. In this case, each of the first n−1 columns with a binary value "0" in the final position, in row m, is subject to an antipodal-mapping-based operation that represents an inverse operation to the antipodal-mapping-based columns operations discussed with reference to FIG. 6. Otherwise, when the final row has not been flipped, as in the example shown in FIG. 7, each of the first n−1 columns with a binary value "1" in the final position, in row m, is subject to the antipodal-mapping-based operation. In a next step, each of the first n−1 columns with a binary value "1" in the final position, in row m, is subject to an antipodal-mapping-based operation that represents an inverse operation to the antipodal-mapping-based columns operations discussed with reference to FIG. 6. For example, column 706 in array 704 has a binary value "1" in the last position, in row m, and has therefore been mapped, in the encoding step, by an antipodal mapping. Therefore, the initial m−1 bits in the column are subjected to the antipodal mapping which, as discussed above, regenerates the m−1 bits of the column that were present prior to the antipodal mapping employed in the encoding step. Inversing the antipodal mapping of the encoding step in this fashion leads to array 708. Note that the bit flags in the final row do not need to be inverted, since they have no further use in decoding. In a next step, bits 710 and 711 are compared to determine whether or not the final column was flipped in the penultimate step of encoding. When these two bits have the same binary value, either "0" or "1," the final column has not been flipped. Otherwise, the final column has been flipped. In the example shown in FIG. 7, bits 710 and 711 have different values, indicating that the final column of the array was flipped in the penultimate step of the encoding process. Therefore, each of the rows having a binary value "0" in the final column were inverted, during encoding. These rows are indicated by arrows, such as arrow 712, in FIG. 7. Had the final column not been flipped, as would have been the case were bits 710 and 711 both either "0" or "1, then each of the rows having a binary value "1" in the final column would have been inverted, during encoding. The initial n−1 entries in each of these rows is inverted, to produce array 714. The row-inversion bit flags in the final column do not need to be flipped, as the initial entries of the rows are inverted, since they are no longer needed for decoding. Finally, the initial n−1 entries in the first m−2 rows of the array, and the initial n−2 entries in the second-to-last row of the array, are extracted, row by row, and appended to an initially empty string u to produce the final decoded bit string u 716 shown at the bottom of FIG. 7. The extracted bits are shown in array 718 in FIG. 7, to clearly indicate which of the elements of the array are used to generate u. Comparison of bit string u 716 in FIG. 7 to bit string u 602 in FIG. 6 reveals that decoding of the encoded bit string c has faithfully reproduced the initially encoded bit string u.

Figure 8:
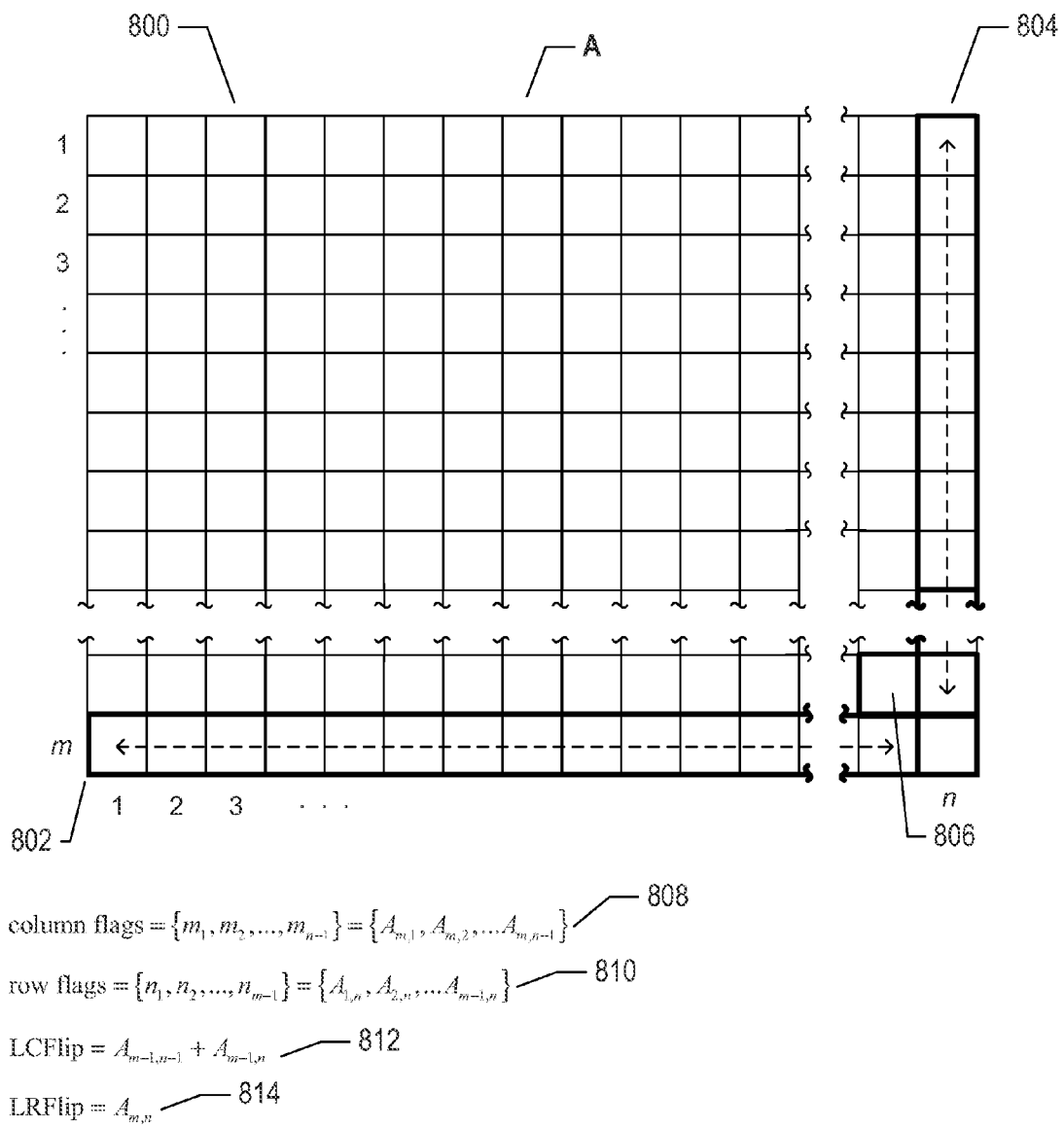
FIG. 8 illustrates an array A that is a logical framework for encoding bit strings and decoding encoded bit strings according to certain examples of the present invention.

FIG. 8 illustrates an array A that is a logical framework for encoding bit strings and decoding encoded bit strings according to certain examples of the present invention. The array A is an m×n array that represents an m×n crossbar into which encoded bit strings with mn entries are stored and from which encoded bit strings are extracted. However, the array A is a logical structure. A given implementation of the encoding and decoding techniques that represent examples of the present invention may store binary values in any of many different data structures, provided that they are accessed in ways that implement the operations described below. A code word c is stored in array A by extracting successive groups of n bits from the code word and placing them into successive rows of the array A. Information bits from a bit string u are stored in array A, in preparation for encoding, by extracting successive groups of n−1 bits from the code word and placing them into successive rows of the array A, with the last group of bits extracted from u having n−2 bits. The final row m 802 of array A is filled with zeros and the final column n 804 of array A is also filled with zeros. In addition, a zero is entered into array element $A_{m-1, n-1}$ 806. The initial n−1 entries in the final row m comprise a set of column flags 808, indicating which columns have been subjected to an antipodal mapping during encoding. The initial m−1 entries in the final column comprise a set of row flags 810 that indicate which rows have been inverted during the encoding step. The sum, using modulo-2 arithmetic, of array entries $A_{m-1,n-1}$ and $A_{-1,n}$ generates a binary value LCFlip 812, which indicates whether or not the first m−1 entries in last column of array A were flipped during encoding. When LCFlip has the value "1," the first m−1 entries in last column were flipped. When LCFlip has the value "0," the first m−1 entries in last column were not flipped. The array element $A_{m,n}$ contains a binary value LRFlip 814, which indicates, in similar fashion to LCFlip, whether the last row of array A was flipped during encoding. As in the C programming language, a binary value "0" corresponds to Boolean value FALSE and a binary value "1" corresponds to Boolean value "1."

Next, in FIGS. 9A-D and 10A-B, control-flow diagrams are provided to illustrate an encoding method and decoding method that represent examples of the present invention. These methods are generally incorporated, by logic circuits, firmware and/or software instructions, or some combination of circuits and instructions, within a memory controller of an electronic memory in order to encode input data for storage into one or more crossbar arrays within the electronic memory and to decode data extracted from the one or more crossbar arrays within the electronic memory for output from the electronic memory. Alternatively, the encoding and decoding methods that represent examples of the present invention may be incorporated within computer systems as logic circuits, firmware and/or software instructions, or a combination of logic circuits, firmware, and/or software for encoding data prior to transmission to electronic memories and for decoding data retrieved from electronic memories. The data encoding ensures that no crossbar column or row has sufficiently low resistance to carry currents great enough to damage or destroy the crossbar arrays or to lead to data corruption when standard operational voltages are applied to the crossbar array during READ and WRITE operations. Thus the encoding and decoding methods that represent examples of the present invention are incorporated within physical computer systems, electronic memories, and other devices and systems that electronically store data.

Figure 9A:
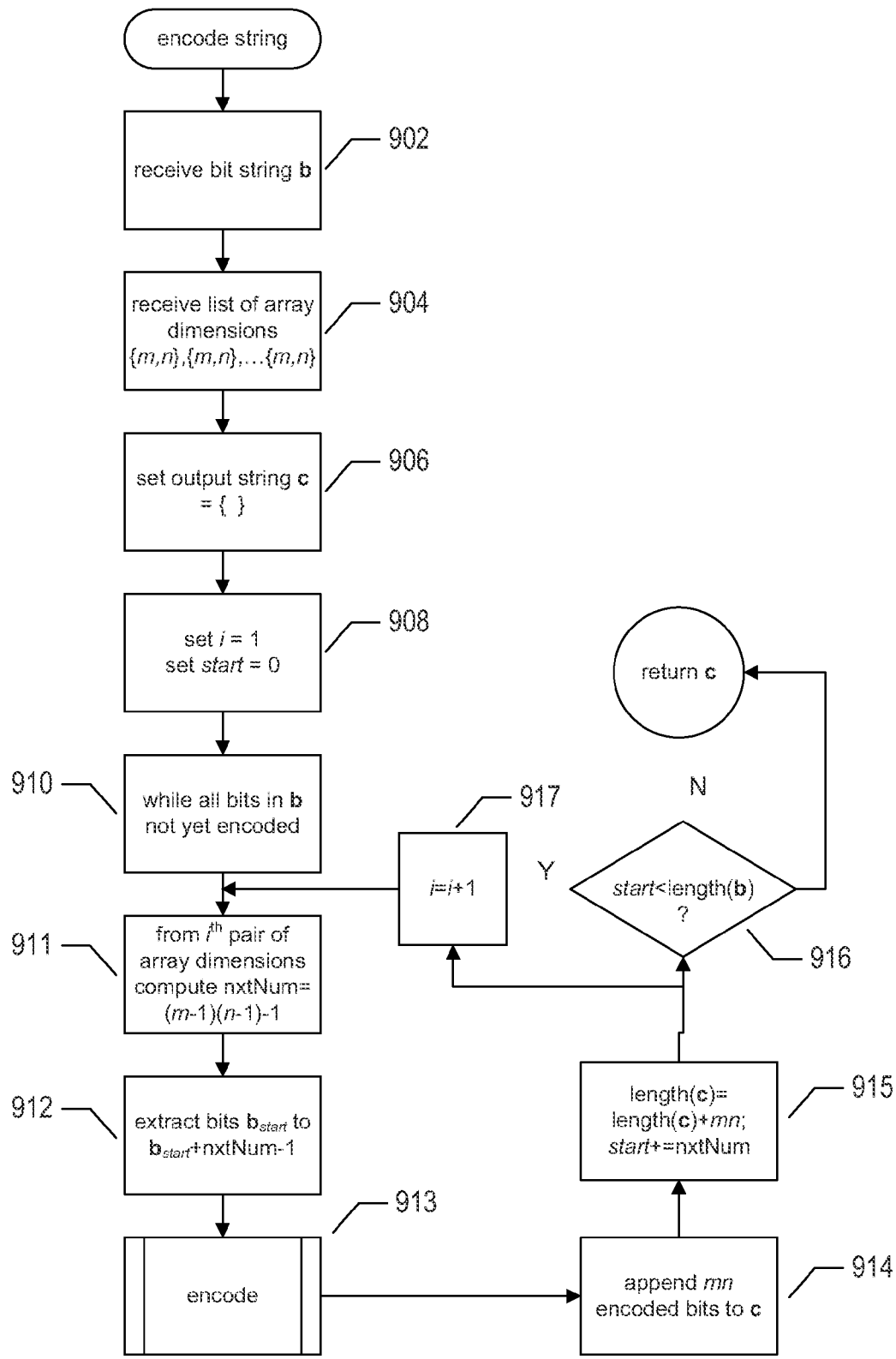
FIGS. 9A-D provide control-flow diagrams that illustrate encoding of bit strings by an encoding method that represents an example of the present invention.

FIGS. 9A-D provide control-flow diagrams that illustrate encoding of bit strings by an encoding method that represents an example of the present invention. FIG. 9A provides a control-flow diagram for a routine "encodeString" which encodes a received bit string b for storage into one or more crossbar arrays. The one or more crossbar arrays are described by a received list of array-dimension pairs. In step 902, the bit string b to be encoded for storage into the one or more arrays is received. In step 904, a list of array-dimension pairs is received, each array-dimension pair including the number of rows and columns, m and n, in a crossbar array into which a portion of the encoded string b is to be stored. In step 906, an output bit string, or code word c, is set to the empty string. In step 908, an iteration variable i is set to 1 and a data-extraction index start is set to 0. Then, in the while-loop of steps 910-917, received bit string b is encoded to produce encoded bit string c. In step 911, the $i^{th}$ pair of array dimensions is extracted from the received list of array dimensions, and a variable nxtNum is set to (m−1)(n−1)−1, or the number of unencoded bits can be stored into the $i^{th}$ array. In step 912, the number of bits nxtNum is extracted from the remaining unencoded bits of received bit string b and encoded via a call to the routine "encode" in step 913. The routine "encode," described below, carries out the encoding process discussed above with reference to FIG. 6. The output from the routine "encode" is appended to the encoded string c in step 914, and the length of encoded string c is increased by mn and the variable start is increased by nxtNum, in step 915, in preparation for the next iteration of the while-loop. When the variable start is less than the length of input string b, as determined in step 916, then the iteration variable i is incremented, in step 917, and a next iteration of the while-loop carried out by returning control to step 911. Otherwise, the encoded string c is returned. Thus, the routine "encodeString" encodes input strings of arbitrary length to produce a code word for storage into one or more crossbar arrays that together provide sufficient capacity for storing the encoded input bit string c.

Figure 9B:
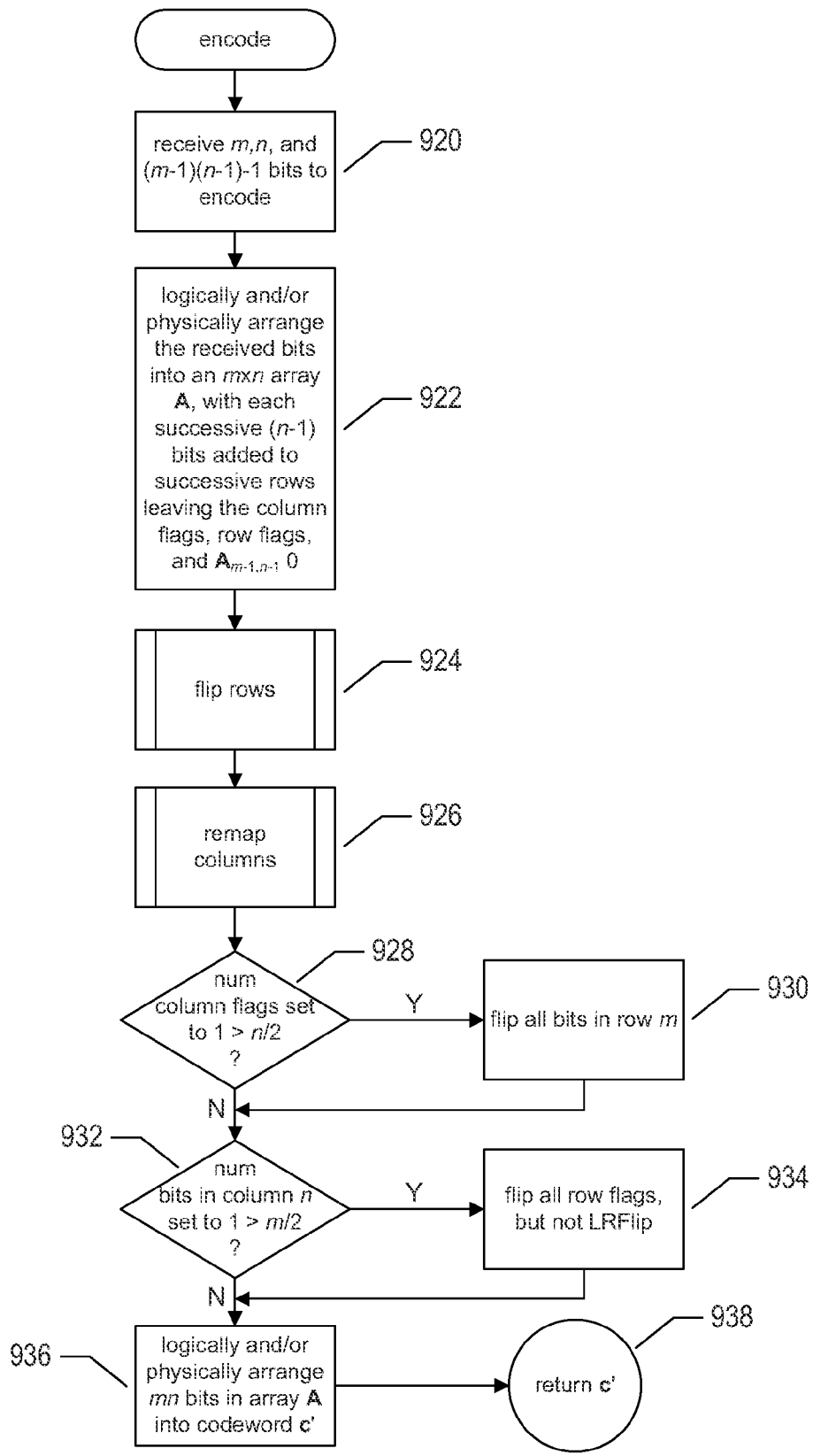
Figure 9C:
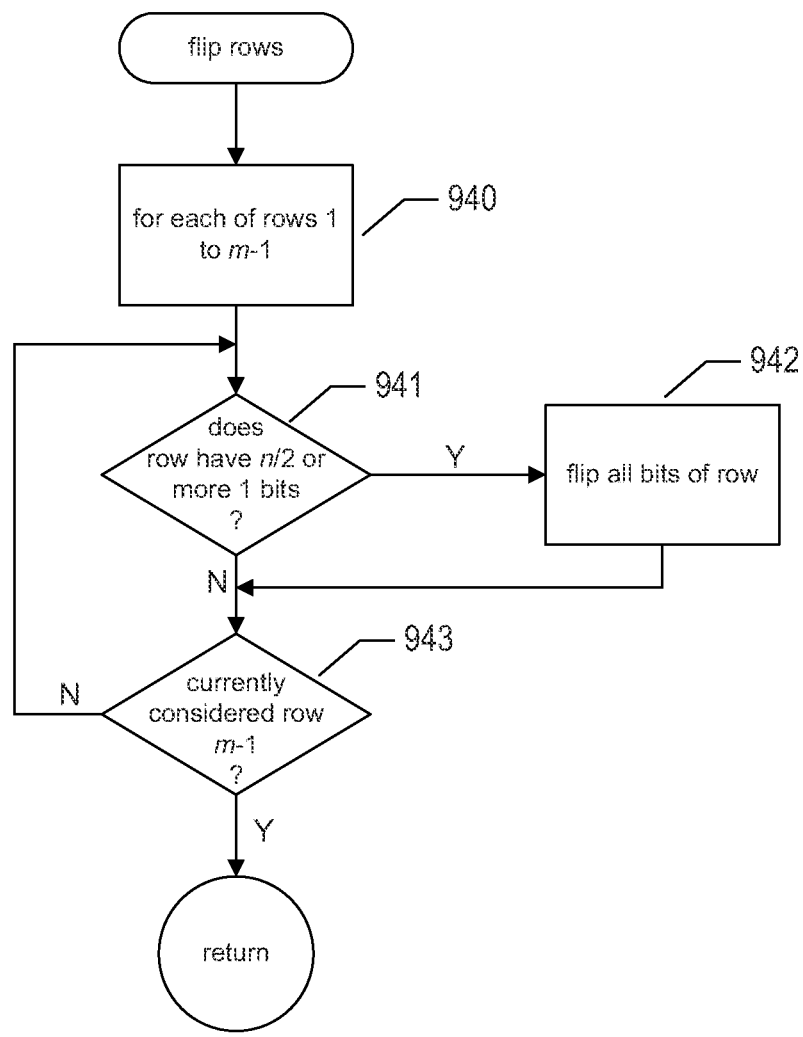
Figure 9D:
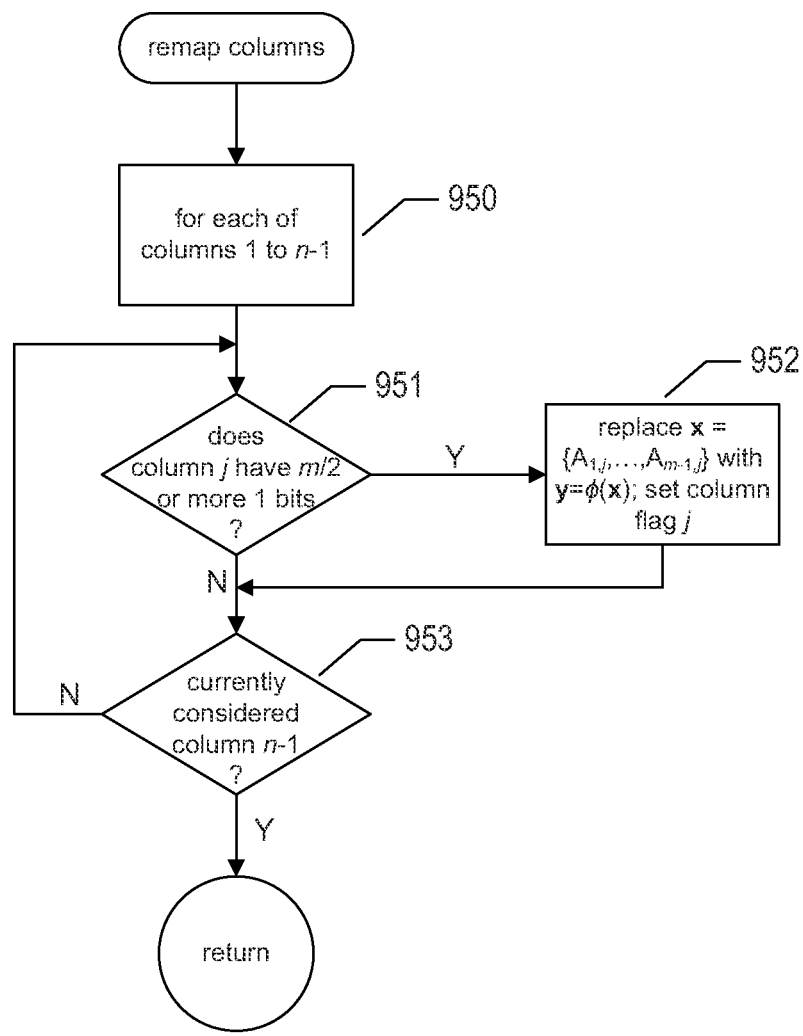

FIGS. 9B-D provide control-flow diagrams for the routine "encode," called in step 913 of FIG. 9A, which implements the method discussed above with reference to FIG. 6. In step 920, the number of rows and columns, m and n, respectively, of a next m×n array and (m−1)(n−1)−1 bits for encoding into a code word to be placed into the m×n array are received. In step 922, the received bits are logically and/or physically arranged into an m×n array A, discussed above with reference to FIG. 8. Successive groups of n−1 bits are extracted from the received string and placed into the first m−2 rows of array A. A final group of n−2 bits is extracted from the bit string and placed into the second-to-last row of array A. The final row and column of array A are set to 0, as is array element $A_{m-1,n-1}$ (806 in FIG. 8). In step 924, rows of array A may be flipped, or inverted, as discussed above with reference to FIG. 6, in a first pass over the array A via a call to the routine "flip rows," and, in step 926, the initial m−1 bits of the columns of array A may be remapped, or subjected to the same antipodal mapping to which they were subjected to during encoding, as discussed above with reference to FIG. 6, in a second pass over the array A via a call to the routine "remap columns." When the number of column flags in array A having binary value "1" is greater than n/2, as determined in step 928, then, as discussed above with reference to FIG. 6, the final row m of array A is flipped, or inverted, in step 930. When the number of bits in column n with binary value "1" is greater than m/2, as determined in step 932, then all of the row flags, but not the array entry corresponding to LRFlip, are inverted in step 934. In a final step 936, the mn bits of array A are extracted, row-by-row, and appended to initially empty code word c', which is returned in step 938.

FIG. 9C provides a control-flow diagram for the routine "flipRows" called in step 924 of FIG. 9B. The routine "flip-Rows" comprises a for-loop of steps 940-943 in which each of rows 1 to m−1 in array A are considered. Each of these considered rows having a Hamming weight greater than or equal to n/2 is flipped, or inverted, as discussed above with reference to FIG. 6.

FIG. 9D provides a control-flow diagram of the routine "remap columns," called in step 926 of FIG. 9B. The routine "remap columns" comprises a for-loop of steps 950-953 in which each of the columns 1 to n−1 of array A are considered. When a next-considered column has a Hamming weight greater than or equal to m/2, then the first m−1 entries in the column are replaced by a bit string generated by an antipodal mapping of the first m−1 entries in the column, in step 952. In addition, the column flag is set to "1" for a column for which the first m−1 entries replaced by an antipodal mapping of the original bits of the column, in step 952.

Figure 10A:
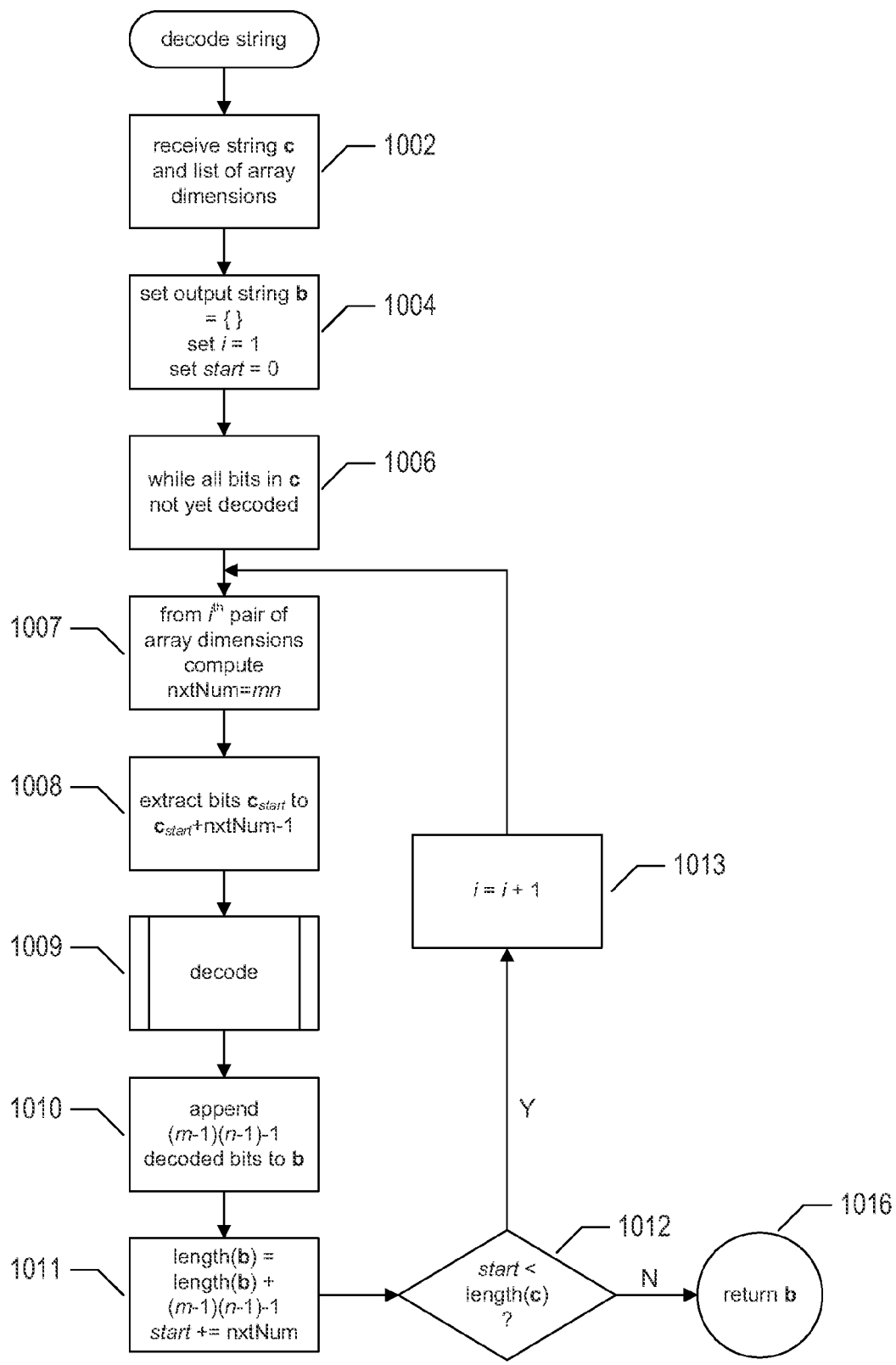
FIGS. 10A-B provide control-flow diagram that illustrate decoding of bit strings by a decoding method that represents an example of the present invention.
Figure 10B:
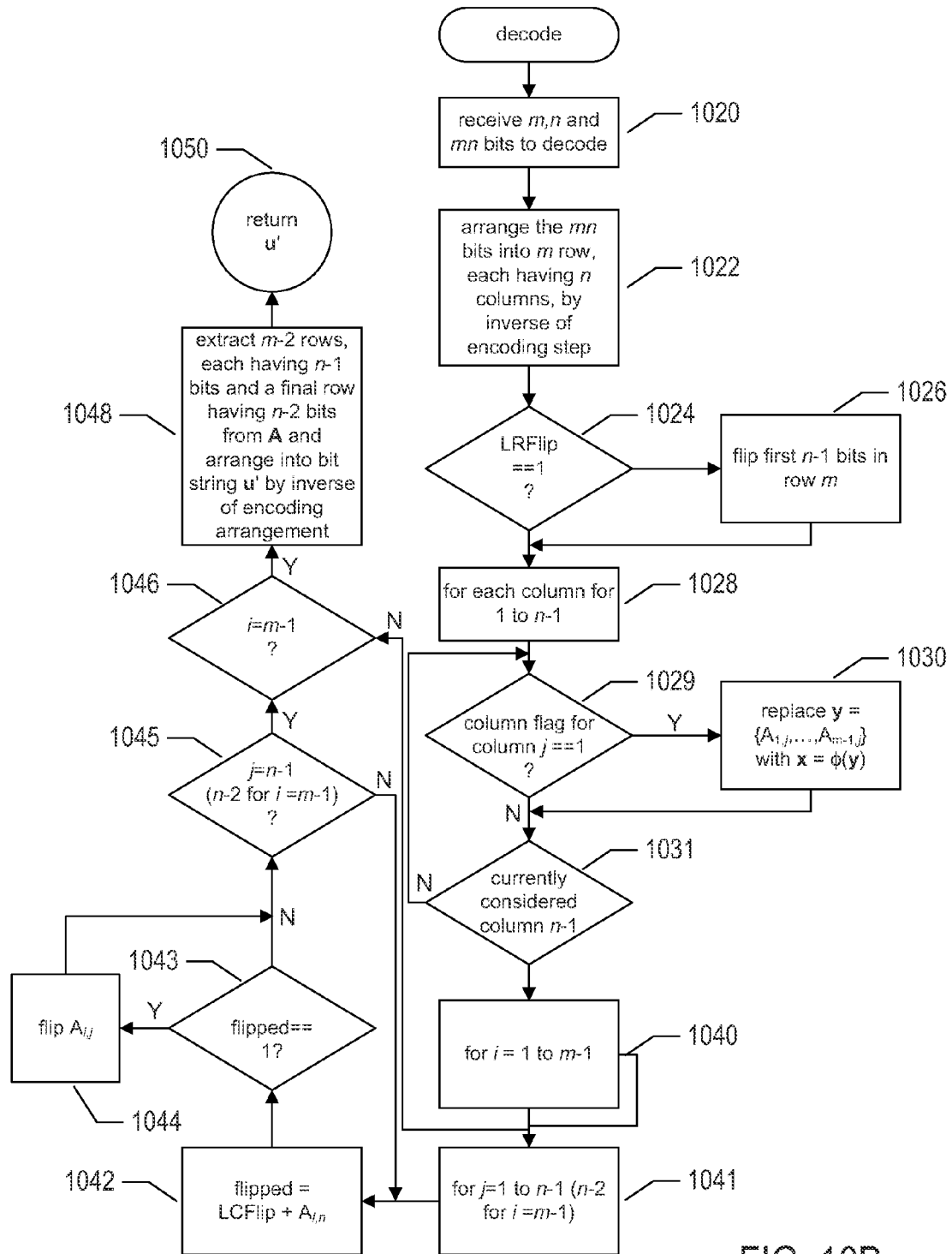

FIGS. 10A-B provide control-flow diagrams that illustrate decoding of bit strings by a decoding method that represents an example of the present invention. FIG. 10A provides a control-flow diagram for a routine "decodeString" which decodes an encoded string c that was encoded by the encoding method discussed above with reference to FIGS. 9A-D, according to one example of the present invention. In step 1002, the encoded string c and a list of array-dimension pairs is received. In step 1004, an output string b is set to the empty string, an iteration variable i is set to 1, and a bit-extraction index start is set to 0. Then, in the while-loop of steps 1006-1013, a next group of bits is extracted from the encoded string c for decoding via a call to the routine "decode," in step 1009, in each iteration of the while-loop. In step 1007, a next number of bits to extract from the encoded string c is computed from the $i^{th}$ pair of array dimensions and placed into variable nxtNum. In step 1008, nxtNum bits are extracted from input string c. In step 1009, the extracted bits are decoded via a call to the routine "decode," which decodes the bits as discussed above with reference to FIG. 7. In step 1010, the decoded bits are appended to output string b. In step 1011, the length of the output string b is accordingly increased and the index start is incremented by nxtNum. When start is less than the length of the input string, as determined in step 1012, then iteration variable i is incremented, in step 1013, and control returns to step 1007 for another iteration of the while-loop. Otherwise, the decoded string b is returned in step 1016.

FIG. 10B provides a control-flow diagram of the routine "decode" called in step 1009 of FIG. 10A, which represents an example of the present invention. In step 1020, the array dimensions m and n are received, along with mn bits for decoding. In step 1022, the received bits are arranged, row-by-row, into the m×n array A. Again, as in the encoding step, bits may be physically stored within a two-dimensional array, or may instead be logically considered to be arranged in two dimensions but stored in some alternative fashion. When the value LRFlip, discussed above with reference to FIG. 8, corresponds to Boolean value TRUE, as determined in step 1024, then the first n−1 bits in row m of array A are flipped, or inverted, in step 1026. Next, in the for-loop of step 1028-1031, each of columns 1 to n−1 of array are considered. If the column flag for the currently considered column is set, as determined in step 1029, then the first m−1 bits within the column are replaced by an antipodal mapping of those bits, in step 1030. Next, in the nested for-loops of steps 1040-1046, each bit in array A corresponding to data bits (as shown in array 718 in FIG. 7) is considered. In step 1042, the variable "flipped" is set to the sum of LCFlip and the final bit in the row containing the currently considered array element. If the value of "flipped" is "1," as determined in step 1043, then the currently considered array element is flipped, or inverted, in step 1044. In a final step 1048, n−1 bits are extracted from each of the first m−2 rows of array A, and n−2 bits are extracted from the m−1 row of array A, as discussed above with reference to FIG. 7, and appended to output string u', which is returned in step 1050 by the routine "decode."

Although, in the first antipodal-mapping implementation discussed above, each position in a bit string with binary value "1" is examined for minimality, a more efficient method for generating the set of minimal positions is provided by the following method:

```
Input: x' = (x'_j)_{j∈Z_n} with s(x') > 0
Data structures: i, t ∈ Z_n; σ,μ ∈ Z; P ⊆ Z_n
    i = 0;
    σ = μ = 0;
    P = ∅;
    do {
        if (σ ≤ μ) { μ = σ; t = i; };
        σ+ = x'_i;
        i++;
    } while (i ≠ 0);
    m = σ;
    while (m > 0)
    {
        if (σ ≤ m) {P = P ∪ {t}; m--;}
        t--;
        σ- = x'_i;
    }
Output: P
```

In this method, $Z_n$ is the set of all positions in string x'. Increment and decrement operations on the position indices i and t are modulo n. The input string x' contains values "1" and "−1", having been mapped from a bit string by mapping b( ). In the first loop, a do-while loop that traverses the positions of string x' from 0 to n−1, where n is the length of string x', the number of bits with value "1" in excess of the number of bits with value "−1" is counted, with the result stored in σ. In addition, the variable t points to the first minimal position detected in string x' in the traversal of string x', position-by-position, from left to right. In the second loop, a while loop, the minimal positions are determined and placed into set P, starting with the first detected minimal position referenced by variable t.

As discussed above, there are many different ways in which the antipodal mapping can be carried out. A second method for antipodal mapping, which does not rely on identifying minimal positions within an input string according to the above-described method, is next described.

In the second implementation of antipodal mapping, a one-to-one mapping φ″, which maps a subset of n elements to a disjoint subset of the same size, is employed. An ordered set N of m elements is denoted:

$$N=\{e_0, \ldots, e_{m-1}\}$$

Given sets A and B that are subsets of N, $$A \subseteq N$$

$$B \subseteq N$$

and given the set difference notation for the set of all elements of A that are not elements of B, $$A \backslash B = \{e_i : e_i \in A \wedge e_i \notin B\}$$

the complement of subset A with respect to set N is denoted:

$$A^c = N \backslash A.$$

The right boundary of A with respect to N is defined as:

$$\text{Boundary\_R}(A|N) = \{e_i : e_i \in A \wedge e_{i+1} \notin A\}$$

where incrementing index i and decrementing index i are modulo m, with m the size of ordered set N, which, for the purposes of the present discussion, can be thought of as a set of bit positions in a bit string. The modulo-m convention for index arithmetic is used throughout the following discussion. Similarly, $$\text{Boundary\_L}(A|N) = \{e_i : e_i \in A \wedge e_{i-1} \notin A\}$$

The set returned by Boundary_R and Boundary_L operating on the empty set ∅ or on N is ∅. The right and left borders of set A are defined as:

$$\text{Border\_R}(A|N) = \text{Boundary\_L}(A^c|N)$$

$$\text{Border\_L}(A|N) = \text{Boundary\_R}(A^c|N)$$

Given, as an example, N to be an ordered set of indices or positions of binary values, or bits, and given A to be a subset of N comprising those positions in which bits have the value "0," then the right and left boundaries of A with respect to N are those positions of bits having value "0" with a subsequent, in the case of the right boundary, and preceding, in the case of the left boundary, bit having value "1." These are the boundary positions within ordered subsets of one or more consecutive positions in N with bit value "0." The right and left borders are the positions with bit value "1" following, in the case of the right border, a right boundary bit with value "0" and preceding, in the case of the left border, a left boundary bit with value "0." Alternatively, given N to be an ordered set of positions of binary values, or bits, and given A to be a subset of N comprising those positions of bits with value "1," then the right and left boundaries of A with respect to N are those positions of bits having value "1" with a subsequent, in the case of the right boundary, and preceding, in the case of the left boundary, bit having value "0." These are the boundary positions within ordered subsets of one or more consecutive positions with bit value "1." The right and left borders are the positions with bit value "0" following, in the case of the right border, a right boundary bit with value "1" and preceding, in the case of the left border, a left boundary bit with value "1."

Formalizing this discussion, let A be a subset of N:

$$N = \{0, 1, \ldots, n-1\}$$

$$A \subseteq N$$

Assume that A has a cardinality L no larger than $$\left\lfloor \frac{n}{2} \right\rfloor,$$

or floor (n/2), where floor (n/2) is the largest integer that is not greater than n/2. Next, a series of sets related to N and A are recursively defined as follows:)

$$N^{(0)} = N$$

$$A^{(0)} = A$$

$$N^{(i)} = N^{(i-1)} \backslash (\text{Boundary\_L}(A^{(i-1)}|N^{(i-1)}) \cup \text{Border\_L}(A^{(i-1)}|N^{(i-1)}))$$

$$A^{(i)} = A^{(i-1)} \backslash (\text{Boundary\_L}(A^{(i-1)}|N^{(i-1)}))$$

Assume that the elements of $N^{(i)}$ are ordered as they appear in $N^{(i-1)}$. The function or mapping φ″ is then defined as:

$$\phi''(A) = \bigcup_{i=0}^{L-1} \text{Border\_L}((A^{(i)}|N^{(i)}))$$

Define a mapping from a binary sequence x with length n to a subset of the integers 0, 1, . . . , n−1 that represent positions of elements in x as follows:

$$g(x) = \{i : x_i = 1\}$$

Thus, Y=g(x) generates the set Y of indices of positions in a binary string having value "1." An inverse operation x=$g^{-1}$(Y) returns a binary string x with length n in which values "1" occur at positions in set Y, and in which "0" occurs at all other positions. Note that g(x) remembers the length of n, or, in other words, the length n remains associated with Y so that $g^{-1}$(Y) can return an x of appropriate length. Additionally, x̄ is the bit string complementary to x, or, in other words, flipped with respect to x. Given a binary string x with $$|x| \geq \frac{n}{2},$$

the antipodal mapping φ(x) discussed above can be implemented as follows:

$$\phi(x) = g^{-1}(\phi''(g(\bar{x})))$$

This antipodal mapping can be extended to map a binary string x of arbitrary Hamming weight as follows:

$$\phi(x) = c(\phi(c(x)))$$

In this second implementation of the antipodal mapping, each recursion removes, from consideration, a next set of bits with value "1" from consideration as minimal positions, where the bit string is considered to be circular, with position 0 following position n−1 and position n−1 preceding position 0. In a first recursion, the rightmost bit with value "1" in each group of all-"1"-valued bits is removed from consideration, along with the bordering 0. In the next recursion, the rightmost bit with value "1" in each new group of all-"1"-valued bits is removed from consideration, along with the bordering 0. A number of recursions removes the rightmost bits from each group, as they emerge, until all remaining bits are 1 and their positions are the minimal positions.

Although the present invention has been described in terms of particular examples, it is not intended that the invention be limited to these examples. Modifications will be apparent to those skilled in the art. For example, a variety of different implementations of the various examples of the present invention can be obtained by varying any of many different implementation parameters, including programming language, modular organization, control structures, data structures, and other such implementation parameters. Any of various implementations of antipodal mapping can be used in encoding and decoding steps. The binary values assigned to bits can follow either of two different conventions. In the above discussion, many steps in the encoding and decoding methods that represent examples of the present invention are described using mathematical notation, but these methods, as discussed above, are computational in nature, and are physically embodied in logic circuits and stored programs. Please note that the operations discussed above can also be employed on more complex memory arrays, in which columns and rows may not all have the same lengths.

The foregoing description, for purposes of explanation, used specific nomenclature to provide a thorough understanding of the invention. However, it will be apparent to one skilled in the art that the specific details are not required in order to practice the invention. The foregoing descriptions of specific examples of the present invention are presented for purpose of illustration and description. They are not intended to be exhaustive or to limit the invention to the precise forms disclosed. Many modifications and variations are possible in view of the above teachings. The examples are shown and described in order to best explain the principles of the invention and its practical applications, to thereby enable others skilled in the art to best utilize the invention and various examples with various modifications as are suited to the particular use contemplated. It is intended that the scope of the invention be defined by the following claims and their equivalents:

The invention claimed is:

1. An electronic-memory-system component comprising:
an array of data-storage elements; and
an encoder that
receives input data,
processes the input data as a two-dimensional array of bits by carrying out two passes, in one pass subjecting a portion of each row of the two-dimensional array of bits having more than a threshold weight to a first weight-reduction operation, and, in another pass, subjecting a portion of each considered column of the two-dimensional array of bits having more than a threshold weight to a second weight-reduction operation, one of the first and second weight-reduction operations employing an antipodal mapping and the other of the first and second weight-reduction operations employing bit inversion,
generates a codeword corresponding to the input data, and
stores the codeword in the array of data-storage elements.

2. The electronic-memory-system component of claim 1 wherein the encoder initially processes the input data as a bit string containing an ordered sequence of bits, each having one of a first value and a second value;
wherein the weight of a column or row is the number of bits in the column or row having the first value;
wherein the two-dimensional array has m rows, each having n bits, and therefore has n columns, each having m bits, the two-dimensional array storing a total of mn bits, each having one of the first value and the second value;
wherein m−2 successive ordered groups of n−1 bits of the bit string, to each of which a row-flag bit is appended, form initial m−2 rows of the two-dimensional array;
wherein a single, final ordered group of n−2 bits of the bit string, to which a first additional bit and then a row-flag bit are appended, form row m−1 of the two-dimensional array;
wherein the first m−1 bits in the final column contain row flags; and
wherein a final row of n−1 column flags and an additional bit forms row m of the two-dimensional array.

3. The electronic-memory-system component of claim 2 wherein bit n−1 in row m−1, bit n in row m, and all of the column flags and row flags are initially set to the second value;
wherein bit n in row m is considered to store binary value LRFlip; and
wherein bits n−1 and n in row m are added together, by modulo-2 arithmetic, to generate binary value LCFlip, which, when having the first value, indicates that the last column has been flipped, and when having the second value, indicates that the last column has not been flipped.

4. The electronic-memory-system component of claim 3 wherein, in a first pass, the encoder inverts each row of the two-dimensional array having $$\frac{n}{2}$$

or more bits with the first value, the inversion changing the row-flag bit from the second value to the first value; and
wherein, in a second pass, the encoder maps the first m−1 bits of each column of the two-dimensional array having $$\frac{m}{2}$$

or more bits with the first value, by an antipodal mapping, to m−1 mapped bits that the encoder then uses to replace the first m−1 bits of the column, the encoder setting the column flag of each column of the two-dimensional array having $$\frac{m}{2}$$

or more bits set to the first value.

5. The electronic-memory-system component of claim 4 wherein, when the final row m of the two-dimensional array has more than $$\frac{n}{2}$$

bits with the first value, the encoder inverts the final row m of the two-dimensional array, with LRFlip indicating whether or not the final row has been inverted; and wherein, when the final column n of the two-dimensional array has more than $$\frac{m}{2}$$

bits with the first value, the encoder inverts the first m−1 bits of the final column n of the two-dimensional array, with LCFlip indicating whether or not the final column has been inverted.

6. An electronic-memory-system component comprising:
an array of data-storage elements; and
a decoder that
  retrieves a codeword from the array of data-storage elements,
  processes the codeword as a two-dimensional array of bits in two passes, in one pass subjecting a portion of each row of the two-dimensional array having a row-flag indication to an inverse first-weight-reduction operation, and, in another pass, subjecting a portion of each considered column of the two-dimensional array having a column-flag indication to an inverse second-weight-reduction operation, one of inverse first-weight-reduction and inverse second-weight-reduction operations employing an antipodal mapping and the other employing bit inversion, and
  extracts bits from the two-dimensional array of bits as a sequence of uncoded bits corresponding to the codeword.

7. The electronic-memory-system component of claim 6 wherein the decoder initially processes the codeword as a bit string containing an ordered sequence of bits, each having one of a first value and a second value;
wherein the weight of a column or row is the number of bits in the column or row having the first value;
wherein the two-dimensional array has m rows, each having n bits, and therefore has n columns, each having m bits, the two-dimensional array storing a total of mn bits, each having one of the first value and the second value;
wherein m successive ordered groups of n bits of the bit string form the m rows of the two-dimensional array;
wherein the initial m−1 bits of the last column contain row flags for the first m−1 rows;
wherein the initial n−1 bits of the final row contain column flags for the first n−1 columns.

8. The electronic-memory-system component of claim 7 wherein bit n in row m is considered to store binary value LRFlip; and
wherein bits n−1 and n in row m are added together, by modulo-2 arithmetic, to generate binary value LCFlip, which, when having the first value, indicates that the last column has been flipped, and when having the second value, indicates that the last column has not been flipped.

9. The electronic-memory-system component of claim 8 wherein, when LRFlip has the first value, a column flag with the second value indicates that the column was subjected to the second weight-reducing operation during encoding, and, when LRFlip has the second value, a column flag with the first value indicates that the column was subjected to the second weight-reducing operation during encoding; and
wherein, when LCFlip has the first value, a row flag with the second value indicates that the row was subjected to the first weight-reducing operation during encoding, and, when LCFlip has the second value, a row flag with the first value indicates that the column was subjected to the first weight-reducing operation during encoding.

10. The electronic-memory-system component of claim 9 wherein, in a first pass, the decoder maps the first m−1 bits of each column of the two-dimensional array that was subjected to the second weight-reduction operation during encoding, by an antipodal mapping, to m−1 mapped bits that the decoder then uses to replace the first m−1 bits of the column; and
in a second pass, the decoder inverts the first n−1 bits of each row that was subjected to the first weight-reduction operation during encoding.

11. A method for carrying out an antipodal mapping $\phi$, the method comprising:
receiving a bit string and storing the bit string in an electronic memory;
determining the minimal bit positions within the bit string; and
inverting the value of the bits at the minimal bit positions within the bit string.

12. The method of claim 11
wherein the antipodal mapping $\phi$ maps a first n-bit bit string x to a second n-bit string y, $y=\phi(x)$; and
wherein the mapping has characteristics:

$$\text{length }(x)=n=\text{length }(y)$$

$$|x|=k \Rightarrow |y|=n-k$$

$$y_i=1 \Rightarrow x_i=1 \text{ when } |x| \geq n/2$$

$$x_i=1 \Rightarrow y_i=1 \text{ when } |x| < n/2$$

$$\phi(\phi(x))=\phi(y)=x$$

where |x| and |y| represent the number of bits in bit string x and bit string y, respectively, having the value "1."

13. The method of claim 12 wherein the minimal positions are found for a bit string with a majority of bits having the value "1" by:
reinterpreting bit values "1" and "0" as "1" and "−1," respectively; and
selecting bit positions as minimal for which all sequences of successive bits within the bit string, with the successive bits wrapping back from the end of the bit string to the beginning of the bit string, when added together, produce a non-negative sum.

14. The method of claim 12 wherein the minimal positions are found for a bit string with less than a majority of bits having the value "1" by:
reversing and complementing, or flipping, the values of each bit in the bit string;
reinterpreting bit values "1" and "0" as "1" and "−1," respectively;
selecting bit positions as minimal for which all sequences of successive bits within the bit string, with the successive bits wrapping back from the end of the bit string to the beginning of the bit string, when added together, produce a non-negative sum; and again reversing and complementing, or flipping, the values of each bit in the bit string.

15. The method of claim 12
wherein the minimal positions are found by recursively removing sets of bits with value "1" from consideration as minimal positions, with the bit string considered to be circular, with position 0 following position n−1 and position n−1 preceding position 0 and wherein, in each recursion, the rightmost bit with value "1" in each group of all-"1"-valued bits is removed from consideration, along with the bordering 0.

\* \* \* \* \*